US010657879B1

(12) United States Patent
Gu et al.

(10) Patent No.: US 10,657,879 B1
(45) Date of Patent: May 19, 2020

(54) GATE DRIVING CIRCUIT, METHOD FOR DRIVING THE SAME, AND DISPLAY APPARATUS

(71) Applicants: Hefei BOE Optoelectronics Technology Co., Ltd., Anhui (CN); BOE Technology Group Co., Ltd., Beijing (CN)

(72) Inventors: Honggang Gu, Beijing (CN); Junsheng Chen, Beijing (CN); Xianjie Shao, Beijing (CN); Yuanbo Zhang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/335,522

(22) PCT Filed: Aug. 17, 2018

(86) PCT No.: PCT/CN2018/101039
§ 371 (c)(1),
(2) Date: Mar. 21, 2019

(87) PCT Pub. No.: WO2019/076124
PCT Pub. Date: Apr. 25, 2019

(30) Foreign Application Priority Data

Oct. 20, 2017 (CN) ............................ 2017 1 0990290

(51) Int. Cl.
*G09G 3/20* (2006.01)
*G11C 19/28* (2006.01)
(52) U.S. Cl.
CPC ............ *G09G 3/2096* (2013.01); *G11C 19/28* (2013.01); *G09G 2300/0871* (2013.01); *G09G 2310/0286* (2013.01)

(58) Field of Classification Search
CPC ......... G09G 3/2096; G09G 2300/0871; G09G 2310/0286; G11C 19/28
See application file for complete search history.

(56) References Cited

U.S. PATENT DOCUMENTS 9,478,310 B2  10/2016  Han et al.
9,640,276 B2   5/2017  Li et al.
(Continued)

FOREIGN PATENT DOCUMENTS

CN    103226981 A    7/2013
CN    103761937 A    4/2014
(Continued)

OTHER PUBLICATIONS

The International Search Report, for International Application No. PCT/CN2018/101039 dated Aug. 17, 2018, 10 pages.
(Continued)

*Primary Examiner* — Sejoon Ahn
(74) *Attorney, Agent, or Firm* — Westman, Champlin & Koehler, P.A.

(57) ABSTRACT

Embodiments of the present disclosure disclose a gate driving circuit, a method for driving the same, and a display apparatus. The gate driving circuit includes N stages of cascaded shift registers, N being an integer greater than or equal to 4. In the N stages of shift registers, an output signal terminal of an $n^{th}$ stage of shift register is connected to an input signal terminal of an $(n+I/2)^{th}$ stage of shift register, and a reset signal terminal of the $n^{th}$ stage of shift register is connected to an output signal terminal of an $(n+K)^{th}$ stage of shift register, wherein n is an integer greater than or equal to 1 and less than (N−I/2), K is an integer greater than I/2 and less than I, and I is a number of clock signal lines connected to the gate driving circuit, which is an even number greater than or equal to 4.

11 Claims, 15 Drawing Sheets

(56) References Cited

U.S. PATENT DOCUMENTS

| | | |
|---|---|---|
| 9,685,134 B2 | 6/2017 | Zhang et al. |
| 9,728,152 B2 | 8/2017 | Jo |
| 2012/0075282 A1 | 5/2012 | Higashijima et al. |
| 2015/0002504 A1 | 1/2015 | Jo |
| 2016/0012911 A1 | 1/2016 | Han et al. |
| 2016/0171915 A1* | 6/2016 | Lee .................. G11C 19/28 345/211 |
| 2016/0171933 A1* | 6/2016 | Takahara ............ G09G 3/3233 345/212 |
| 2016/0171950 A1* | 6/2016 | Cho .................... G09G 3/3677 345/212 |
| 2016/0172054 A1* | 6/2016 | Shao .................. G11C 19/184 345/100 |
| 2016/0173866 A1* | 6/2016 | Kim .................... G09G 3/003 345/694 |
| 2016/0268004 A1 | 9/2016 | Li et al. |
| 2016/0300542 A1 | 10/2016 | Zhang et al. |
| 2017/0270879 A1 | 9/2017 | Han et al. |
| 2017/0365204 A1 | 12/2017 | Choi et al. |

FOREIGN PATENT DOCUMENTS

| | | |
|---|---|---|
| CN | 104252851 A | 12/2014 |
| CN | 104299594 A | 1/2015 |
| CN | 105206243 A | 12/2015 |
| CN | 105304011 A | 2/2016 |
| KR | 20110077108 A | 7/2011 |

OTHER PUBLICATIONS

The Written Opinion, including English translation of Box V, for International Application No. PCT/CN2018/101039 dated Aug. 17, 2018, 7 pages.

* cited by examiner

US 10,657,879 B1

GATE DRIVING CIRCUIT, METHOD FOR DRIVING THE SAME, AND DISPLAY APPARATUS

CROSS-REFERENCE TO RELATED APPLICATION(S)

This application is a Section 371 National Stage application of International Application No. PCT/CN2018/101039, filed on 17 Aug. 2018, and claims priority to the Chinese Patent Application No. 201710990290.2, filed on Oct. 20, 2017, the contents of which are incorporated herein by reference in their entireties.

TECHNICAL FIELD

The present disclosure relates to the field of display, and more particularly, to a gate driving circuit, a method for driving the same, and a display apparatus.

BACKGROUND

In a Thin Film Transistor (TFT)-based Liquid Crystal Device (LCD), a gate driving circuit for driving a gate may be formed on a display panel to form a Gate drive On Array (GOA) panel. The gate driving circuit comprises a plurality of cascaded shift register units. In a conventional gate driving circuit, an output signal of a next stage of shift register unit is usually used as a reset signal of the stage of shift register unit, and an output signal of a previous stage of shift register unit is usually used as an input signal of the stage of shift register unit.

However, in a case of a conventional gate driving circuit, especially where a plurality of clocks are used, a display apparatus may exhibit a flash screen phenomenon.

SUMMARY

Embodiments of the present disclosure provide a gate driving circuit, a method for driving the same, and a display apparatus.

According to an aspect of the embodiments of the present disclosure, there is provided a gate driving circuit, comprising N stages of cascaded shift registers, N being an integer greater than or equal to 4, wherein in the N stages of shift registers, an output signal terminal of an $n^{th}$ stage of shift register is connected to an input signal terminal of an $(n+I/2)^{th}$ stage of shift register, and a reset signal terminal of the $n^{th}$ stage of shift register is connected to an output signal terminal of an $(n+K)^{th}$ stage of shift register, wherein n is an integer greater than or equal to 1 and less than (N−I/2), K is an integer greater than I/2 and less than I, and I is a number of clock signal lines connected to the gate driving circuit, which is an even number greater than or equal to 4.

In an example, each stage of shift register among the N stages of shift registers comprises:

an output sub-circuit connected to an output signal terminal, a clock signal input terminal for receiving a clock signal of the stage of shift register and a pull-up control node of the stage of shift register, and configured to turn on a connection between the clock signal input terminal and the output signal terminal when the pull-up control node is at an active operating level;

a reset sub-circuit connected to a reset signal terminal for receiving a reset signal, the pull-up control node and a first level terminal for providing a first level respectively, and configured to reset the pull-up control node to the first level under control of the reset signal;

an input sub-circuit connected to an input signal terminal for receiving an input signal, the pull-up control node of the stage of shift register and a second level terminal for providing a second level respectively, and configured to provide the second level to the pull-up control node under control of the input signal, wherein the second level is different from the first level; and a control sub-circuit connected to a control signal terminal for receiving a control signal, a first fixed level terminal for providing a first fixed level, the output signal terminal and the pull-up control node respectively, and configured to turn on a connection between the first fixed level terminal and the output signal terminal under control of the control signal and the pull-up control node.

In an example, a first stage of shift register to an $N^{th}$ stage of shift register are sequentially connected to, through the clock signal terminals thereof, a first clock signal line to an $I^{th}$ clock signal line which are arranged sequentially and cyclically, so as to receive a first clock signal to an $I^{th}$ clock signal, respectively, wherein every two adjacent clock signals are different by 1/I of a clock cycle.

In an example, each clock signal has a duty ratio of 50%.

In an example, the control sub-circuit comprises: a first transistor, wherein a gate of the first transistor is connected to the pull-up control node, a first electrode of the first transistor is connected to the first fixed level terminal, and a second electrode of the first transistor is connected to a pull-down control node of the stage of shift register; a second transistor, wherein a gate and a first electrode of the second transistor are connected commonly to the control signal terminal, and a second electrode of the second transistor is connected to the pull-down control node; a third transistor, wherein a gate of the third transistor is connected to the pull-down control node, a first electrode of the third transistor is connected to the first fixed level terminal, and a second electrode of the third transistor is connected to the pull-up control node; a fourth transistor, wherein a gate of the fourth transistor is connected to the pull-down control node, a first electrode of the fourth transistor is connected to the first fixed level terminal, and a second electrode of the fourth transistor is connected to the output signal terminal; and a second capacitor, wherein a first electrode of the second capacitor is connected to the pull-down control node, and a second electrode of the second capacitor is connected to the first fixed level terminal.

In an example, the control signal is an inversion of the clock signal of the stage of shift register.

In an example, the control sub-circuit comprises: a first transistor, wherein a gate of the first transistor is connected to the pull-up control node, a first electrode of the first transistor is connected to the first fixed level terminal, and a second electrode of the first transistor is connected to the pull-down control node; a second transistor and a third transistor, wherein a gate and a first electrode of the second transistor are commonly connected to the control signal terminal, a second electrode of the second transistor is connected to a gate of the third transistor, a first electrode of the third transistor is connected to the control signal terminal, and a second electrode of the third transistor is connected to the pull-down control node; a fourth transistor, wherein a gate of the fourth transistor is connected to the pull-down control node, a first electrode of the fourth transistor is connected to the first fixed level terminal, and a second electrode of the fourth transistor is connected to the output signal terminal; a sixth transistor, wherein a gate of the sixth transistor is connected to the pull-up control node, a first electrode of the sixth transistor is connected to the first fixed level terminal, and a second electrode of the sixth transistor is connected to the gate of the third transistor; and a seventh transistor, wherein a gate of the seventh transistor is connected to the pull-down control node, a first electrode of the seventh transistor is connected to the first fixed level terminal, and a second electrode of the seventh transistor is connected to the pull-up control node.

In an example, the control signal is a signal at a second fixed level different from the first fixed level.

In an example, the reset sub-circuit comprises a reset transistor, wherein a gate of the reset transistor is connected to the reset signal terminal, a first electrode of the reset transistor is connected to the first level terminal, and a second electrode of the reset transistor is connected to the pull-up control node.

In an example, the reset sub-circuit is further connected to a total reset signal terminal for receiving a total reset signal, and the reset sub-circuit further comprises an eighth transistor and a ninth transistor, wherein a gate of the eighth transistor is connected to the total reset signal terminal, a first electrode of the eighth transistor is connected to the first fixed level terminal, and a second electrode of the eighth transistor is connected to the pull-up control node; and a gate of the ninth transistor is connected to the total reset signal terminal, a first electrode of the ninth transistor is connected to the first fixed level terminal, and a second electrode of the ninth transistor is connected to the output signal terminal.

In an example, the reset sub-circuit further comprises a tenth transistor, wherein a gate of the tenth transistor is connected to the reset signal terminal, a first electrode of the tenth transistor is connected to the control signal terminal, and a second electrode of the tenth transistor is connected to the pull-down control node.

According to another aspect of the embodiments of the present disclosure, there is provided a display apparatus, comprising the gate driving circuit according to the embodiments described above.

According to yet another aspect of the embodiments of the present disclosure, there is provided a method for driving the gate driving circuit according to the embodiments described above, comprising:

providing a frame start vertical signal to the first stage of shift register; and providing clock signals to the respective stages of shift registers of the gate driving circuit.

In an example, the method further comprises: providing a total reset signal to various stages of shift registers of the gate driving circuit.

The embodiments of the present disclosure provide a gate driving circuit, a method for driving the same, and a display apparatus comprising the gate driving circuit. According to the gate driving circuit of the present disclosure, a phase relationship of clock signals and reset signals input to various stages of shift register units is adjusted by, for example, improving a cascading relationship of the stages of shift register units in the gate driving circuit without modifying a structure of the conventional shift register, which can effectively alleviate the occurrence of a flash screen phenomenon due to, for example, an extremely short reset time of the shift register units.

BRIEF DESCRIPTION OF THE ACCOMPANYING DRAWINGS

DETAILED DESCRIPTION

Figure 1:
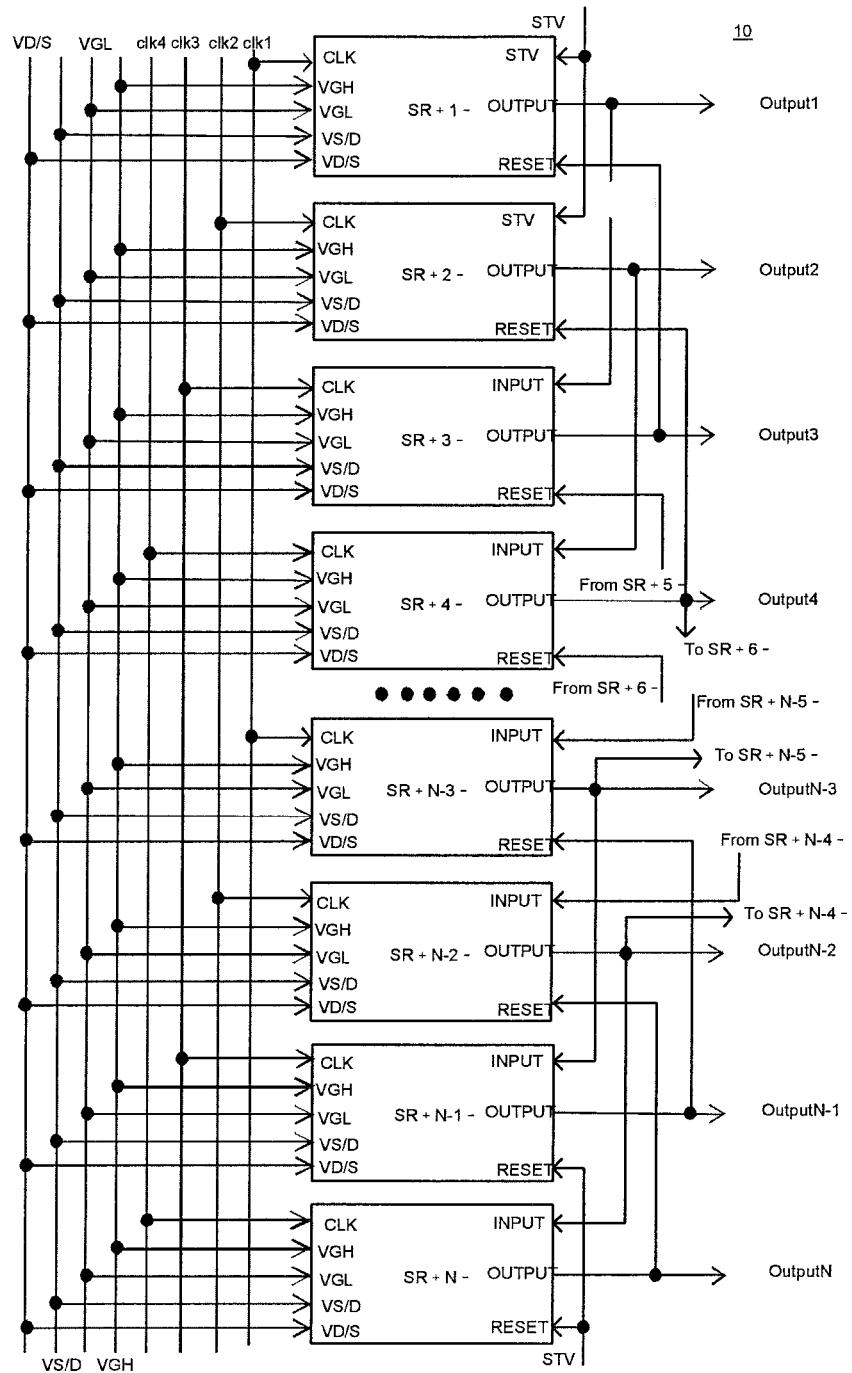
FIG. 1 illustrates an exemplary schematic diagram of a gate driving circuit.

In order to make the purposes, technical solutions and advantages of the embodiments of the present disclosure more clear, the technical solutions in the embodiments of the present disclosure will be clearly and completely described below in conjunction with the accompanying drawings in the embodiments of the present disclosure. Obviously, the embodiments described are a part of the embodiments of the present disclosure instead of all the embodiments. All other embodiments obtained by those of ordinary skill in the art based on the described embodiments of the present disclosure without contributing any creative work are within the protection scope of the present disclosure. It should be illustrated that throughout the accompanying drawings, the same elements are represented by the same or similar reference signs. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be illustrated that shapes and dimensions of components in the figures do not reflect true sizes and proportions, but only illustrate contents of the embodiments of the present disclosure.

Unless otherwise defined, technical terms or scientific terms used in the embodiments of the present disclosure should be of ordinary meanings to those skilled in the art. "First", "second" and similar words used in the embodiments of the present disclosure do not represent any order, quantity or importance, but are merely used to distinguish between different constituent parts.

Furthermore, in the description of the embodiments of the present disclosure, the term "connected" or "connected to" may mean that two components are directly connected, or that two components are connected via one or more other components. In addition, the two components can be connected or coupled by wire or wirelessly.

In addition, in the description of the embodiments of the present disclosure, the terms "first level" and "second level" are only used to distinguish magnitudes of the two levels from each other. For example, the following description is made by taking the "first level" being a low level and the "second level" being a high level as an example. The term "active operating level" refers to a level which may control a transistor to be turned on. It can be understood by those skilled in the art that the present disclosure is not limited thereto.

The transistors used in the embodiments of the present disclosure may each be a thin film transistor or a field effect transistor or other devices having the same characteristics. In one embodiment, the thin film transistor used in the embodiments of the present disclosure may be an oxide semiconductor transistor. Since a source and a drain of the thin film transistor used herein are symmetrical, the source and the drain thereof may be interchanged. In the embodiments of the present disclosure, one of the source and the drain is referred to as a first electrode, and the other of the source and the drain is referred to as a second electrode. In the following examples, the description is made by taking an N-type thin film transistor as an example. It can be understood by those skilled in the art that the embodiments of the present disclosure may obviously applied to a case of a P-type thin film transistor.

FIG. 1 illustrates a cascaded schematic diagram of an exemplary gate driving circuit 10. As shown in FIG. 1, the gate driving circuit 10 may comprise N stages of shift registers, wherein each stage of shift register among the N stages of shift registers has a clock signal terminal CLK, an input signal terminal INPUT, an output signal terminal OUTPUT, and a reset terminal RESET. In a case where four clock signals clk1, clk2, clk3, and clk4 are used in the example of FIG. 1, a clock signal terminal CLK of an $n^{th}$ stage of shift register is connected to the clock signal clk1, a clock signal terminal CLK of an $(n+1)^{th}$ stage of shift register is connected to the clock signal clk2, a clock signal terminal CLK of an $(n+2)^{th}$ stage of shift register is connected to the clock signal clk3, and a clock signal terminal CLK of an $(n+3)^{th}$ stage of shift register is connected to the clock signal clk4. An input signal terminal INPUT of the $n^{th}$ stage of shift register is connected to an output signal terminal OUTPUT of an $(n-2)^{th}$ stage of shift register, and an output signal terminal OUTPUT of the $n^{th}$ stage of shift register is connected to an input signal terminal INPUT of the $(n+2)^{th}$ stage of shift register and a reset terminal RESET of the $(n-2)^{th}$ stage of shift register, where N is an integer greater than or equal to 2, and n is an integer greater than 2 and less than or equal to N. It can be understood by those skilled in the art that input signal terminals INPUT of a first stage of shift register SR(1) and a second stage of shift register SR(2) and reset terminals of an $(N-1)^{th}$ stage of shift register SR(N-1) and an $N^{th}$ stage of shift register SR(N) may be connected to a frame Start Vertical (STV) signal line.

Figure 2:
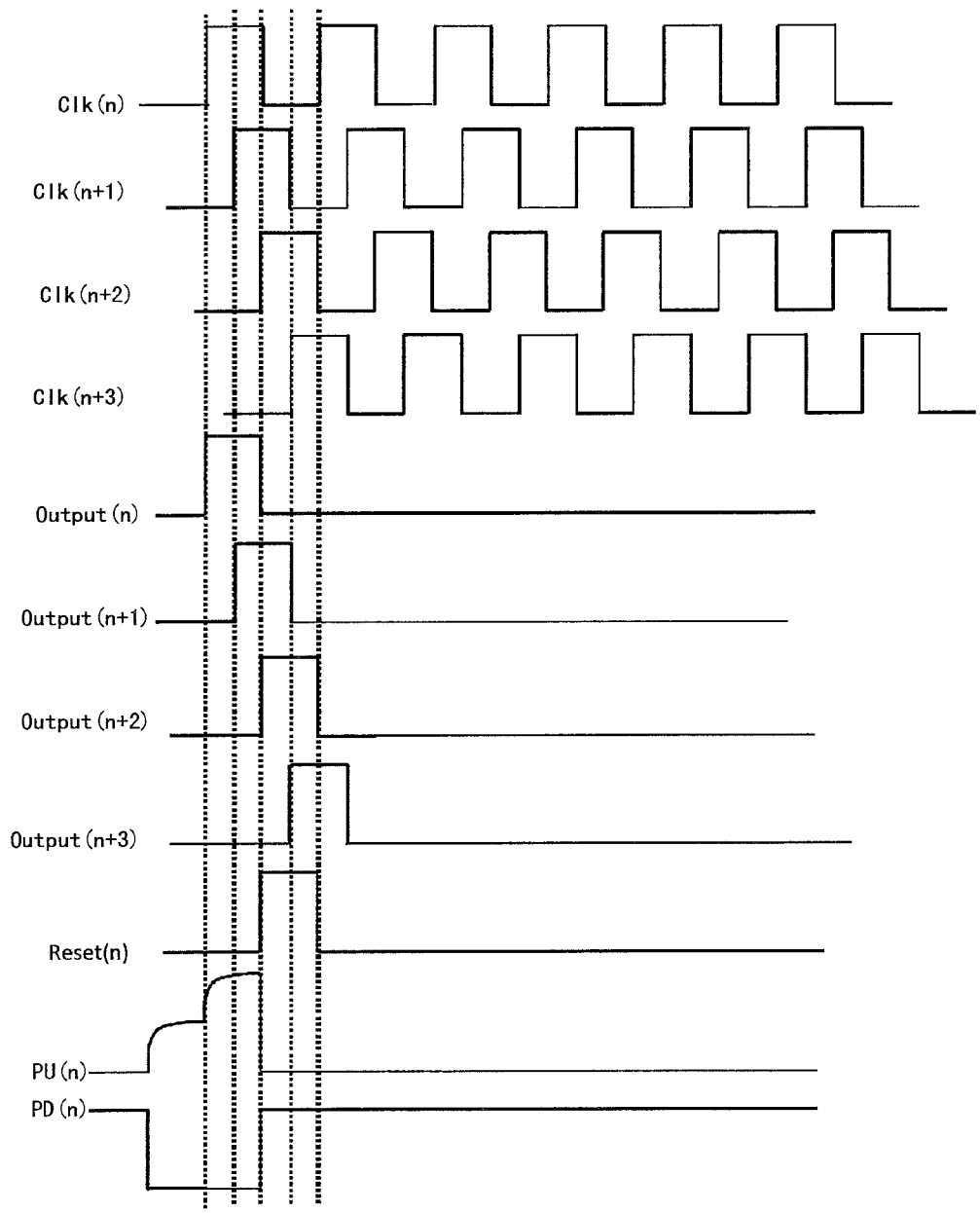
FIG. 2 illustrates an operating timing diagram of the gate driving circuit in FIG. 1.

FIG. 2 illustrates an exemplary operating timing diagram of the gate driving circuit in FIG. 1. For example, for convenience of understanding, expressions Clk(n) to Clk(n+3) are used to represent clock signals connected to $n^{th}$ to $(n+3)^{th}$ stages of shift registers respectively. The clock signals Clk(n) to Clk(n+3) may, for example, have a duty cycle of 50%, and phases of the clock signals Clk(n) to Clk(n+3) are different by a quarter of a clock cycle in sequence. By taking the $n^{th}$ stage of shift register as an example, the clock signal terminal CLK of the $n^{th}$ stage of shift register inputs the clock signal Clk(n), an output signal Output(n) at the output signal terminal OUTPUT of the $n^{th}$ stage of shift register is input to the input signal terminal INPUT of the $(n+2)^{th}$ stage of shift register, and an output signal Output(n+2) at an output signal terminal OUPUT of the $(n+2)^{th}$ stage of shift register is input to a reset terminal RESET of the $n^{th}$ stage of shift register as a reset signal Reset(n) of the $n^{th}$ stage of shift register. PU(n) in FIG. 2 illustrates a voltage waveform at a pull-up control node PU of the $n^{th}$ stage of shift register, and PD(n) in FIG. 2 illustrates a voltage waveform at a pull-down control node PD of the $n^{th}$ stage of shift register.

Figure 3:
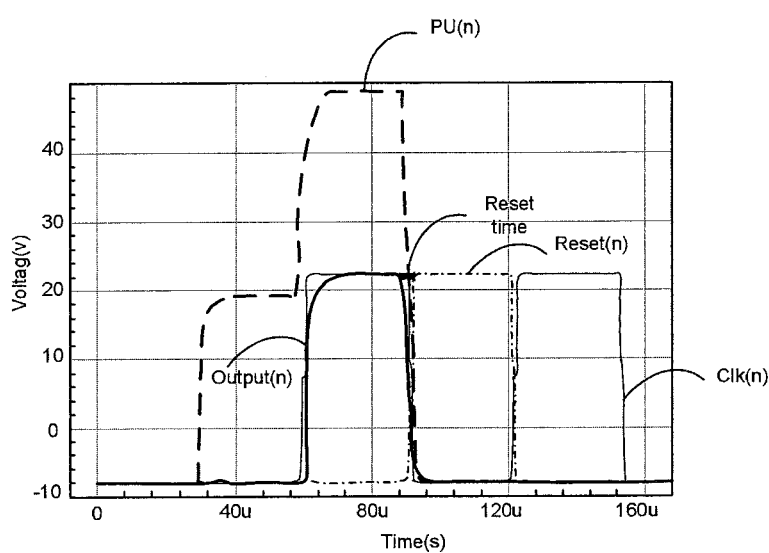
FIG. 3 is a detailed diagram illustrating comparison of voltage waveforms at various points in an $n^{th}$ stage of shift register of the gate driving circuit in FIG. 1.

FIG. 3 is a detailed diagram illustrating comparison of voltage waveforms at various points in the $n^{th}$ stage of shift register of the gate driving circuit in FIG. 1. As shown in FIG. 3, a broken line PU(n) represents a waveform of a voltage at a pull-up control node PU of the shift register, a thin solid line Clk(n) represents a waveform of a clock signal of the shift register, a thick solid line Output(n) represents a waveform of an output signal of the $n^{th}$ stage of shift register, and a dotted line Reset(n) represents a waveform of a reset signal of the shift register. "Reset time" indicates time from a falling edge (a second edge) of an output signal of the shift register to a rising edge (a first edge) of a reset signal of the shift register. As can be seen from FIG. 3, each of the shift registers in the gate driving circuit shown in FIG. 1 has a very short reset time. "Falling time" indicates time required for an output signal level of the shift register to fall from a highest level to 95% of the highest level, and the "falling time" in the example of FIG. 3 is 6.1 us. It has been found that the "reset time" is too short to enable the shift register circuit to be completely reset, which in turn causes the display apparatus using the gate driving circuit to have a flash screen and a too low "yield".

Figure 4A:
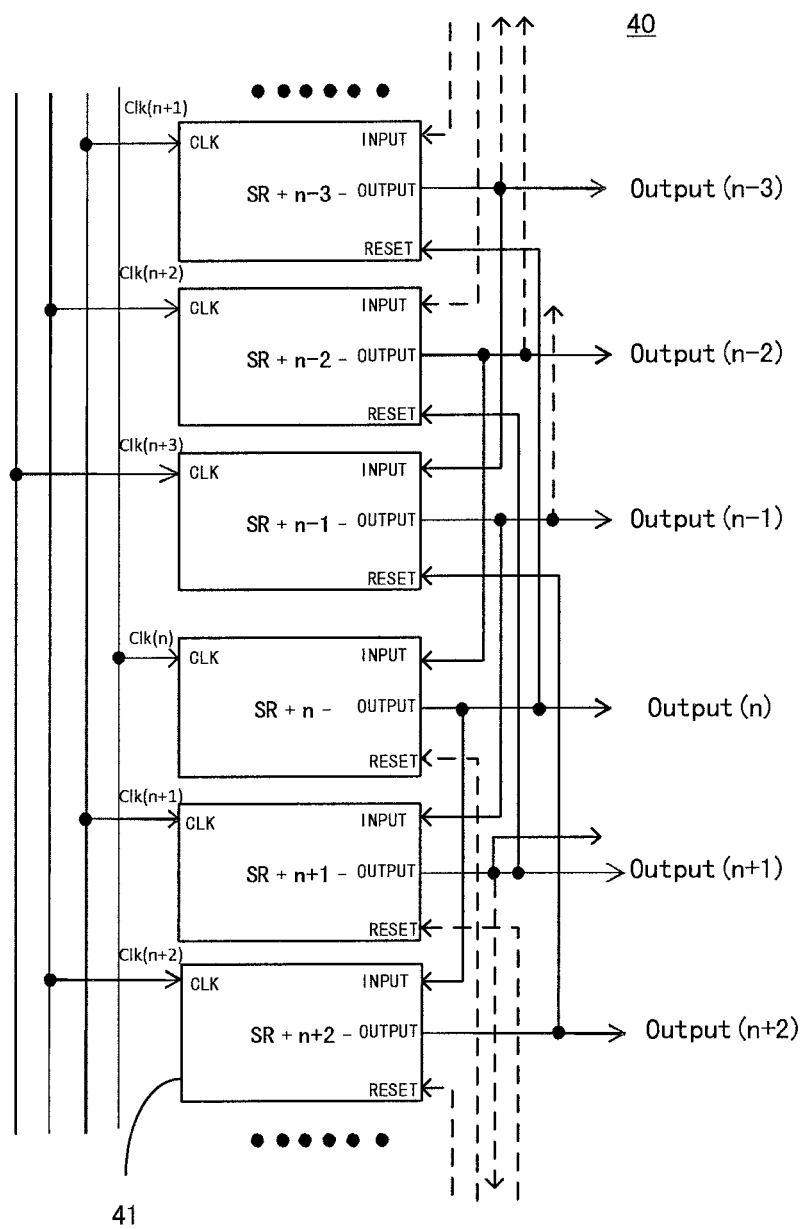
FIG. 4 illustrates a schematic block diagram of a gate driving circuit according to an embodiment of the present disclosure.
Figure 4B:
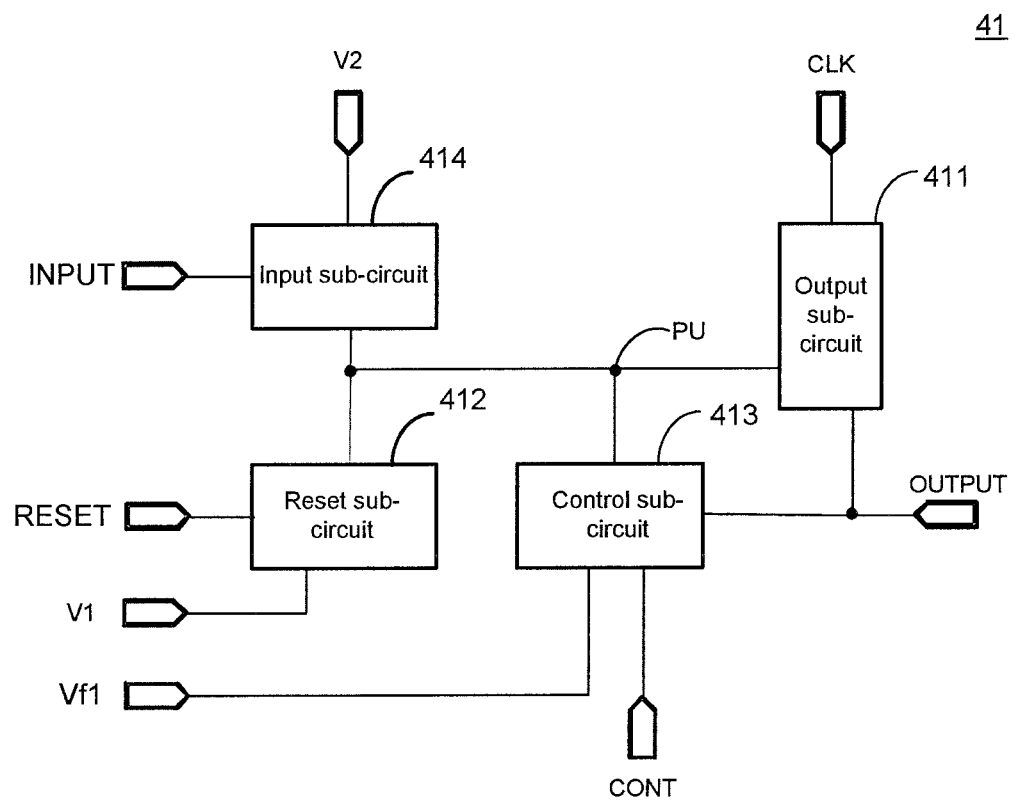

Therefore, the present disclosure provides a gate driving circuit. FIG. 4A illustrates a schematic block diagram of a gate driving circuit according to an embodiment of the present disclosure. As shown in FIG. 4A, the gate driving circuit 40 according to the embodiment of the present disclosure may comprise multiple stages of shift register units 41. FIG. 4B illustrates a schematic block diagram of a shift register unit 41 in a gate driving circuit according to an embodiment of the present disclosure. The gate driving circuit according to the embodiments of the present disclosure will be described in detail below with reference to FIGS. 4A and 4B.

As shown in FIG. 4A, the gate driving circuit is connected to four clock signals, and in the multiple stages of shift registers 41, an output signal terminal of an (n−3)$^{th}$ stage of shift register is connected to an input signal terminal of an (n−1)$^{th}$ stage of shift register, a reset signal terminal of the (n−3)$^{th}$ stage of shift register is connected to an output signal terminal of an n$^{th}$ stage of shift register; and in the multiple stages of shift registers 41, an output signal terminal of an (n−2)$^{th}$ stage of shift register is connected to an input signal terminal of the n$^{th}$ stage of shift register, and a reset signal terminal of the (n−2)$^{th}$ stage of shift register is connected to an output signal terminal of an (n+1)$^{th}$ stage of shift register, and so on.

As shown in FIG. 4B, each stage of shift register unit 41 may comprise an output sub-circuit 411. The output sub-circuit 411 is connected to an output signal terminal OUTPUT, a clock signal input terminal CLK for receiving a clock signal of the stage of shift register unit, and a pull-up control node PU of the stage of shift register unit, and is configured to turn on a connection between the clock signal input terminal CLK and the output signal terminal OUTPUT when a pull-up control node PU is at an active operating level.

The shift register unit 41 may further comprise a reset sub-circuit 412. The reset sub-circuit 412 is connected to a reset signal terminal RESET for receiving a reset signal, the pull-up control node PU and a first level terminal V1 for providing a first level v1, respectively. The reset sub-circuit 412 is configured to reset the pull-up control node PU to the first level v1 under control of the reset signal Reset.

According to an embodiment of the present disclosure, a clock pulse of a clock signal Clk(n) of the stage of shift register unit has a first clock pulse edge EC1 and a second clock pulse edge EC2 which lags behind the first clock pulse edge. A reset pulse of a reset signal Reset(n) has a first reset pulse edge ER1 and a second reset pulse edge ER2 which lags behind the first reset pulse edge ER1. The first reset pulse edge ER1 lags behind the second clock pulse edge EC2 by no longer than duration P of the clock pulse of the clock signal Clk(n) of the stage of shift register unit.

The shift register unit 41 may further comprise a control sub-circuit 413. The control sub-circuit 413 is connected to a control signal terminal CONT for receiving a control signal, a first fixed level terminal Vf1 for providing a first fixed level, the output signal terminal OUTPUT, and the pull-up control node PU respectively. The control sub-circuit 413 is configured to turn on a connection between the first fixed level terminal Vf1 and the output signal terminal OUTPUT under control of the control signal and the pull-up control node PU.

The shift register unit 41 may further comprise an input sub-circuit 414. The input sub-circuit 414 is connected to an input signal terminal INPUT for receiving an input signal Input, the pull-up control node PU and a second level terminal V2 for providing a second level respectively. The input sub-circuit 414 is configured to provide the second level v2 to the pull-up control node PU under control of the input signal Input. The second level v2 is different from the first level v1.

The present disclosure further provides a method for driving a gate driving circuit and a method for driving a shift register in a gate driving circuit, which may be applied to the gate driving circuit according to the embodiments of the present disclosure and the shift register therein (as shown in, for example, FIGS. 4A-4B etc.) It should be illustrated that serial numbers of various steps in the following method are only used as a representation of the steps for convenience of the description, and should not be regarded as indicating an execution order of the respective steps. This method does not need to be performed exactly in an order as shown, unless explicitly stated.

Figure 5A:
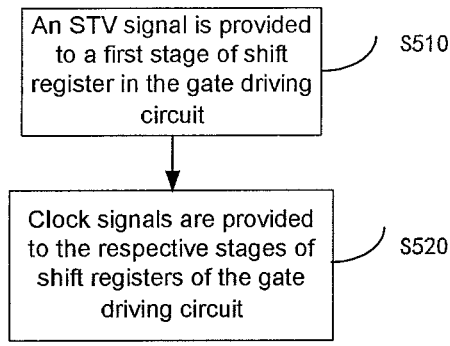
FIG. 5A illustrates a flowchart of a method for driving a gate driving circuit according to an embodiment of the present disclosure.

FIG. 5A illustrates a flowchart of a method for driving a gate driving circuit according to an embodiment of the present disclosure. As shown in FIG. 5A, the method for driving a gate driving circuit according to the embodiment of the present disclosure may comprise the following steps.

In step S510, an STV signal is provided to a first stage of shift register in the gate driving circuit, so that various stages of shift registers start receiving an input signal sequentially, and output corresponding gate driving signals.

In step S520, clock signals are provided to the respective stages of shift registers of the gate driving circuit respectively. An output of each stage of shift register has a desired level under control of a corresponding clock signal in the stage of shift register.

In some embodiments, the method may further comprise: providing a total reset signal to various stages of shift registers of the gate driving circuit respectively.

Figure 5B:
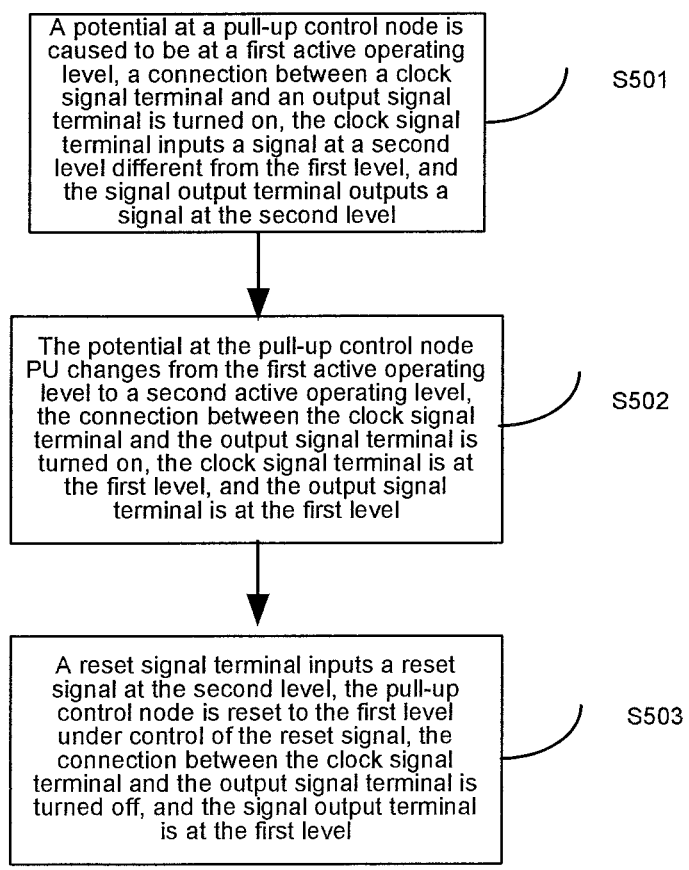
FIG. 5B illustrates a flowchart of a method for driving a shift register of a gate driving circuit according to an embodiment of the present disclosure.

FIG. 5B illustrates a flowchart of a method for driving each stage of shift register in a gate driving circuit.

In step S501, a potential at a pull-up control node PU is caused to be at a first active operating level, a connection between a clock signal terminal and an output signal terminal is turned on, the clock signal terminal inputs a signal at a second level different from the first level, and the output signal terminal outputs a signal at the second level.

In step S502, the potential at the pull-up control node PU changes from the first active operating level to a second active operating level, the connection between the clock signal terminal and the output signal terminal is turned on, the clock signal terminal is at the first level, and the output signal terminal is at the first level.

In step S503, a reset signal terminal inputs a reset signal at the second level, the pull-up control node is reset to the first level under control of the reset signal, the connection between the clock signal terminal and the output signal terminal is turned off, and the output signal terminal is at the first level.

Figure 5C:
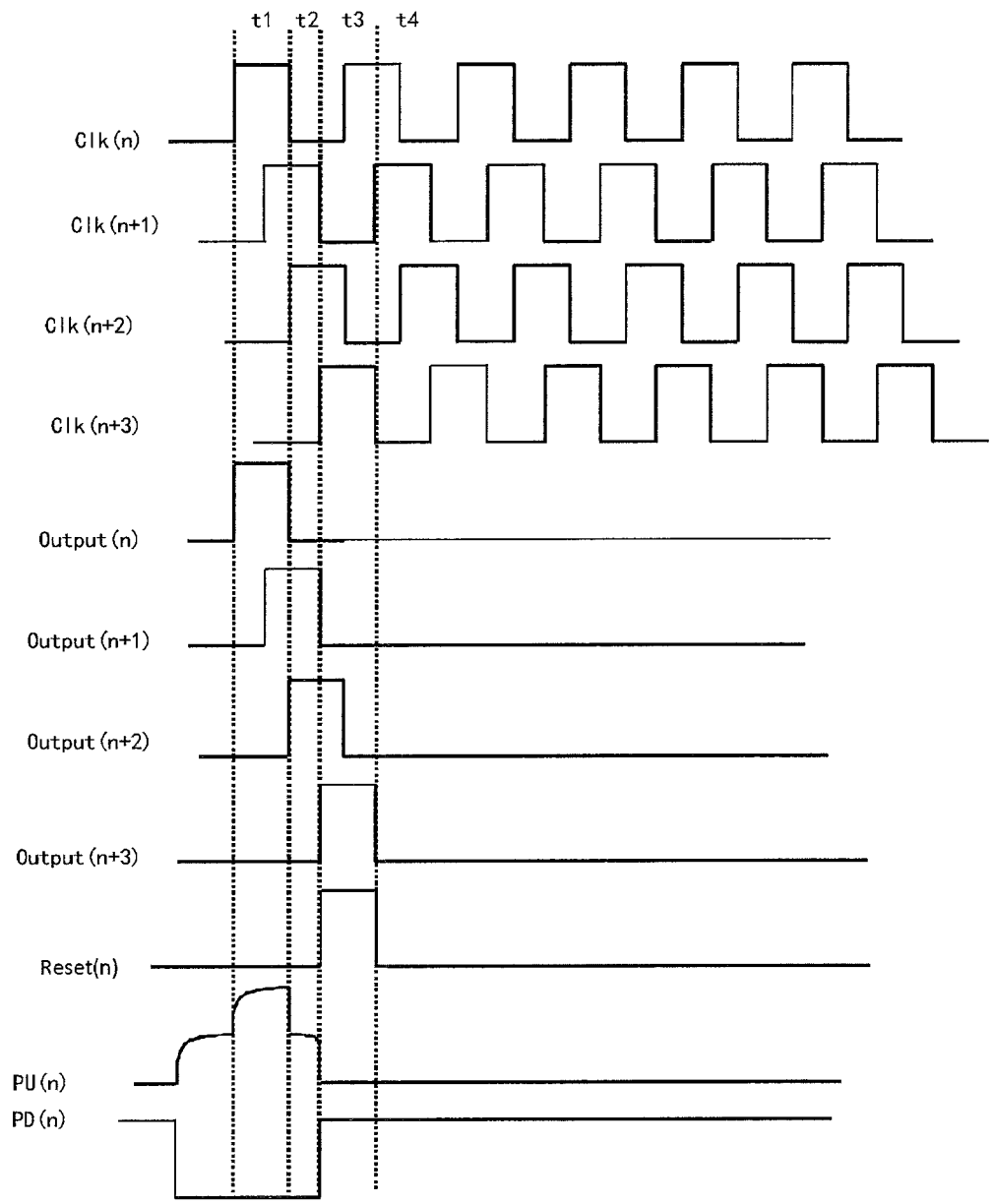
FIG. 5C illustrates an operating timing diagram of a gate driving circuit according to an embodiment of the present disclosure.

FIG. 5C illustrates an operating timing diagram of the gate driving circuit 40 according to an embodiment of the present disclosure. As shown in FIG. 5C, by taking the n$^{th}$ stage of shift register as an example, the clock signal terminal CLK of the n$^{th}$ stage of shift register inputs the clock signal Clk(n), and the output signal Output(n) at the output signal terminal OUTPUT of the n$^{th}$ stage of shift register is input to the input signal terminal INPUT of the (n+2)$^{th}$ stage of shift register. Unlike the operating timing diagram of the gate driving circuit 10 in FIG. 2, in the gate driving circuit 40 according to the embodiment of the present disclosure, an output signal Output(n+3) at an output signal terminal OUPUT of an (n+3)$^{th}$ stage of shift register is input to the reset terminal RESET of the n$^{th}$ stage of shift register as the reset signal Reset(n) of the n$^{th}$ stage of shift register. Similarly, PU(n) in FIG. 5C represents a voltage waveform at the pull-up control node PU of the n$^{th}$ stage of shift register, and PD(n) in FIG. 5C represents a voltage waveform at the pull-down control node PD of the n$^{th}$ stage of shift register.

As shown in FIG. 5C, in a first time period t1, a potential at the pull-up control node PU is at a first active operating level, so that the connection between the clock signal terminal CLK and the output signal terminal OUTPUT is turned on, the clock signal terminal inputs the clock signal Clk(n) at, for example, a high level, and the output signal terminal outputs a signal Output(n) at a high level.

In a second time period t2, the potential at the pull-up control node PU changes from the first active operating level to a second active operating level, the clock signal Clk(n) is at a low level, and the signal Output(n) at the output signal terminal is at a low level. For example, the second active operating level may be lower than the first active operating level, but may still enable the connection between the clock signal terminal CLK and the output signal terminal OUTPUT to be turned on.

In a third time period t3, the reset signal terminal inputs a reset signal Reset(n) at a high level. The voltage PU(n) at the pull-up control node is reset to a low level under control of the reset signal, the connection between the clock signal terminal and the output signal terminal is turned off, and the signal Output(n) at the output signal terminal is at a low level. The driving method according to the embodiment of the present disclosure further comprises: in a fourth time period T4, the reset signal terminal is at a low level, the voltage PU(n) at the pull-up control node is at a low level, and the signal Output(n) at the output signal terminal is at a low level.

Figure 5D:
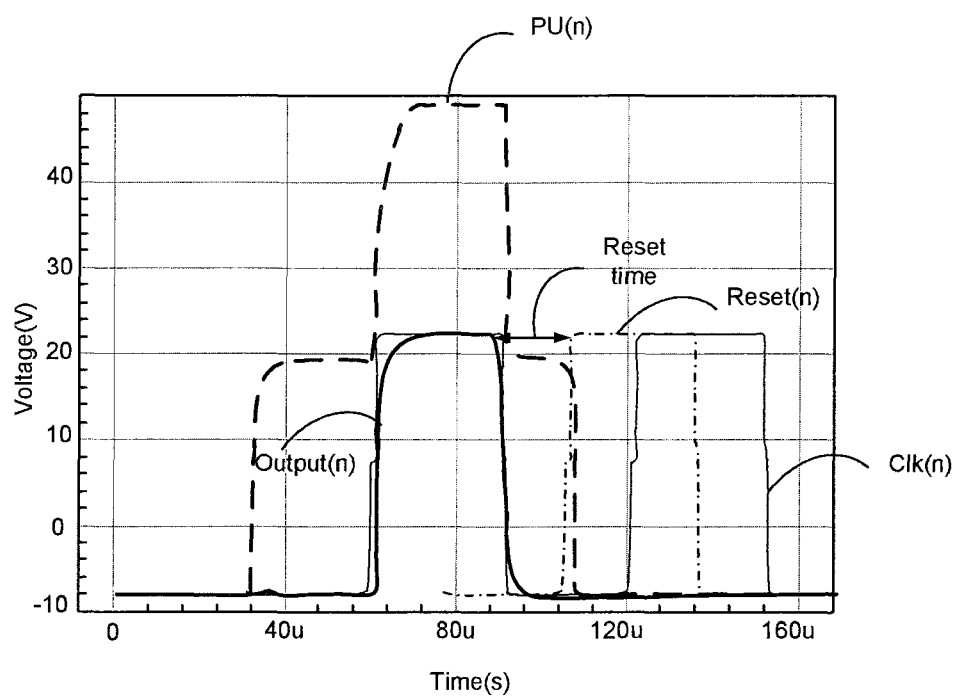
FIG. 5D is a detailed diagram illustrating comparison of voltage waveforms at various points in an $n^{th}$ stage of shift register of the gate driving circuit in FIG. 4.

FIG. 5D is a detailed diagram illustrating comparison of voltage waveforms at various points in FIG. 5C. Similarly to FIG. 3, a dotted line PU(n) in FIG. 5D represents a waveform of a voltage at the pull-up control node PU of the shift register, a thin solid line Clk(n) in FIG. 5D represents a waveform of a clock signal input to the shift register, a thick solid line Output(n) in FIG. 5D represents a waveform of an output signal of the $n^{th}$ stage of shift register, and a dotted line Reset(n) in FIG. 5D represents a waveform of a reset signal of the shift register. Compared with FIG. 3, "reset time" in FIG. 5D, that is, a time from a falling edge (a second edge) of the output signal of the shift register to a rising edge (a first edge) of the reset signal of the shift register, is significantly longer. That is, each shift register in the gate driving circuit shown in FIG. 4A has a longer reset time. "Falling time" in FIG. 5D is 4.2 us, which is significantly less than 6.1 us in FIG. 3. That is, the output signal of the shift register unit of the gate driving circuit according to the embodiment of the present disclosure has a shorter "falling time", and thereby the signal has a steeper waveform at the falling edge, which avoids the occurrence of the flash screen phenomenon.

It can be understood by those skilled in the art that although the above embodiments are described by taking a case where four clock signals are used as an example, the embodiments of the present disclosure may be applied to a case where six clocks or eight clocks are used. In a case where I clock signals are used, where I is an even number greater than or equal to 4, a clock signal terminal of an $n^{th}$ stage of shift register is connected to one of a first clock signal line to an $I^{th}$ clock signal line, an output signal terminal of the $n^{th}$ stage of shift register is connected to an input signal terminal of an $(n+I/2)^{th}$ stage of shift register, and a reset signal terminal of the $n^{th}$ stage of shift register is connected to an output signal terminal of an $(n+K)^{th}$ stage of shift register, where n is an integer greater than or equal to 1 and less than (N−I/2), and K is an integer greater than I/2 and less than I. A first clock signal to an $I^{th}$ clock signal are input to the first clock signal line to the $I^{th}$ clock signal line respectively, and every two adjacent clock signals are different by 1/I of a clock cycle. Each clock signal has a duty cycle of 50%, and I may be equal to an even number such as 4, 6, or 8 or more.

Figure 6A:
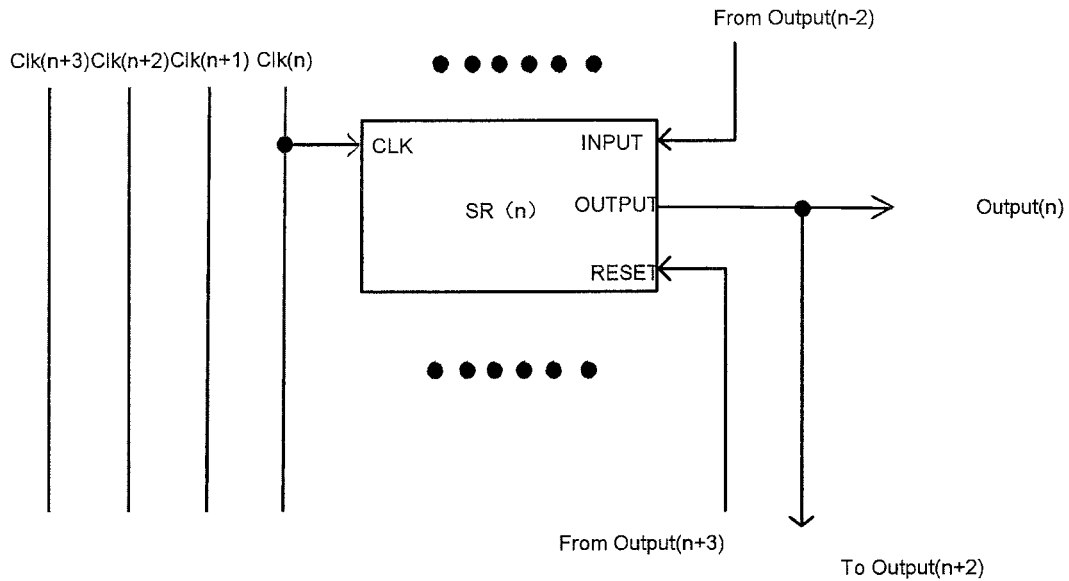
FIG. 6A illustrates an example of a cascading manner of shift register units in a gate driving circuit in which four clock signals are used, according to an embodiment of the present disclosure.
Figure 6B:
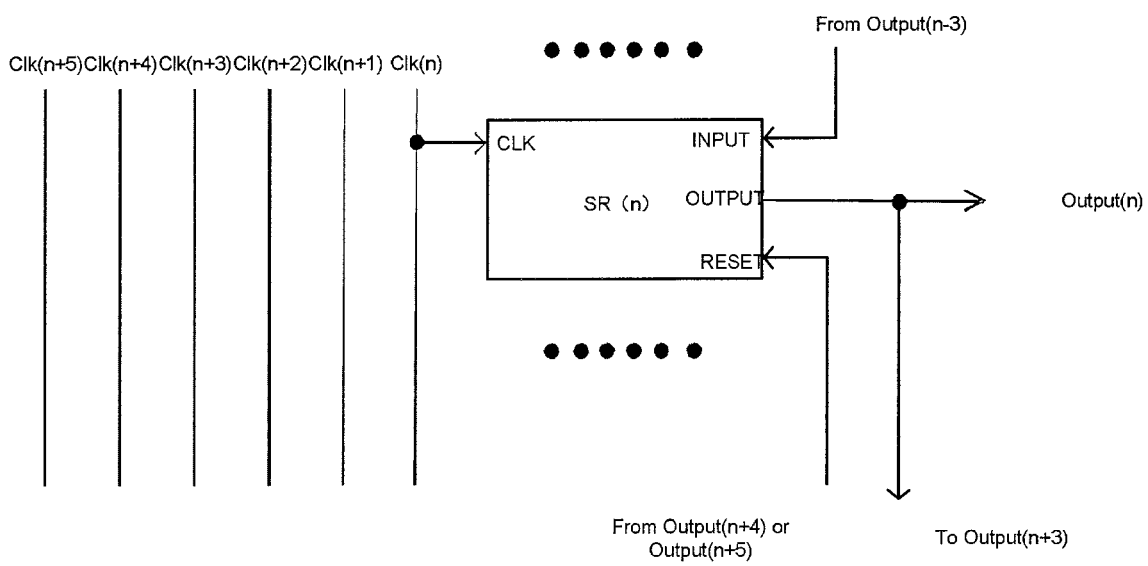
FIG. 6B illustrates an example of a cascading manner of shift register units in a gate driving circuit in which six clock signals are used, according to an embodiment of the present disclosure.
Figure 6C:
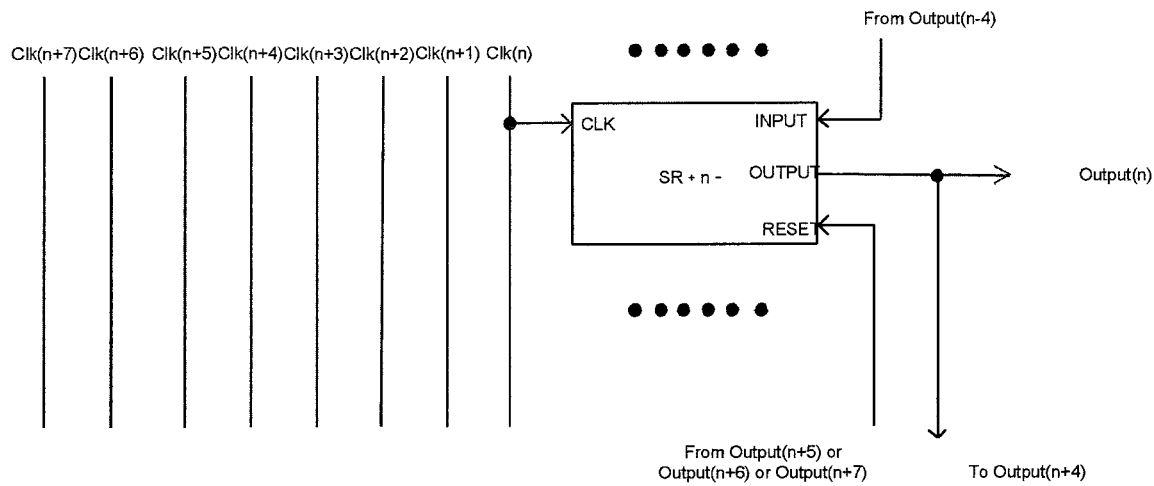
FIG. 6C illustrates an example of a cascading manner of shift register units in a gate driving circuit in which eight clock signals are used, according to an embodiment of the present disclosure.

FIG. 6A illustrates an example of a cascading manner of shift register units in a gate driving circuit in which four clock signals are used, according to an embodiment of the present disclosure. FIG. 6B illustrates an example of a cascading manner of shift register units in a gate driving circuit in which six clock signals are used, according to an embodiment of the present disclosure. FIG. 6C illustrates an example of a cascading manner of shift register units in a gate driving circuit in which eight clock signals are used, according to an embodiment of the present disclosure. For convenience of understanding the present disclosure, an exemplary cascading manner of gate driving circuits according to the embodiment of the present disclosure will be described with reference to FIGS. 6A to 6C.

As shown in FIG. 6A, four clock signals Clk(n) to Clk(n+3) are used in the gate driving circuit according to the embodiment of the present disclosure, wherein a clock signal terminal CLK of an $n^{th}$ stage of shift register unit SR(n) receives a clock signal Clk(n). In FIG. 6A, an INPUT terminal of the $n^{th}$ stage of shift register unit SR(n) is connected to an output signal Output(n−2) of an $(n−2)^{th}$ stage of shift register unit SR(n−2), an output signal Output(n) at an output signal terminal OUTPUT of the $n^{th}$ stage of shift register unit SR(n) is input to an input signal terminal INPUT of an $(n+2)^{th}$ stage of shift register SR(n+2), and a reset terminal RESET of the $n^{th}$ stage of shift register unit SR(n) is connected to an output signal Output(n+3) of an $(n+3)^{th}$ stage of shift register unit SR(n+3).

For the sake of brevity, FIG. 6A only illustrates a connection manner of the $n^{th}$ stage of shift register unit among N stages of shift registers, wherein the gate driving circuit comprises N stages of shift register units, where n is greater than or equal to 3 and less than or equal to (N−2). A connection manner of other stages of shift register units in the gate driving circuit will be apparent to those skilled in the art. For example, unlike the $n^{th}$ stage of shift register unit, INPUT terminals of first and second stages of shift register units are connected to an STV signal, and RESET terminals of $(N−1)^{th}$ and $N^{th}$ stages of shift register units are connected to the STV signal.

As shown in FIG. 6B, six clock signals Clk(n) to Clk(n+5) are used in the gate driving circuit according to the embodiment of the present disclosure, wherein a clock signal terminal CLK of an $n^{th}$ stage of shift register unit SR(n) receives a clock signal Clk(n). In FIG. 6B, an INPUT terminal of the $n^{th}$ stage of shift register unit SR(n) is connected to an output signal Output(n−3) of an $(n−3)^{th}$ stage of shift register unit SR(n−3), an output signal Output(n) at an output signal terminal OUTPUT of the $n^{th}$ stage of shift register unit SR(n) is input to an input signal terminal INPUT of an $(n+3)^{th}$ stage of shift register SR(n+3), a reset terminal RESET of the $n^{th}$ stage of shift register unit SR(n) may be connected to an output signal Output(n+4) of an $(n+4)^{th}$ stage of shift register unit SR(n+4), or the reset terminal RESET of the $n^{th}$ stage of shift register unit SR(n) may be connected to an output signal Output(n+5) of an $(n+5)^{th}$ stage of shift register unit SR(n+5).

Similarly, FIG. 6B only illustrates a connection manner of the $n^{th}$ stage of shift register unit among N stages of shift registers, wherein the gate driving circuit comprises N stages of shift register units, where n is greater than or equal to 4 and less than or equal to (N−3). A connection manner of other stages of shift register units in the gate driving circuit will be apparent to those skilled in the art. For example, unlike the $n^{th}$ stage of shift register unit, INPUT terminals of first, second and third stages of shift register units are connected to an STV signal, and RESET terminals of $(N−2)^{th}$, $(N−1)^{th}$, and $N^{th}$ stages of shift register units are connected to the STV signal.

As shown in FIG. 6C, eight clock signals Clk(n) to Clk(n+7) are used in the gate driving circuit according to the embodiment of the present disclosure, wherein a clock signal terminal CLK of an $n^{th}$ stage of shift register unit SR(n) receives a clock signal Clk(n). In FIG. 6C, an INPUT terminal of the $n^{th}$ stage of shift register unit SR(n) is connected to an output signal Output(n−4) of an $(n-4)^{th}$ stage of shift register unit SR(n−4), an output signal Output (n) at an output signal terminal OUTPUT of the $n^{th}$ stage of shift register unit SR(n) is input to an input signal terminal INPUT of an $(n+4)^{th}$ stage of shift register SR(n+4), a reset terminal RESET of the $n^{th}$ stage of shift register unit SR(n) may be connected to an output signal Output(n+5) of an $(n+5)^{th}$ stage of shift register unit SR(n+5), or the reset terminal RESET of the $n^{th}$ stage of shift register unit SR(n) may be connected to an output signal Output(n+6) of an $(n+6)^{th}$ stage of shift register unit SR(n+6), or the reset terminal RESET of the $n^{th}$ stage of shift register unit SR(n) may be connected to an output signal Output(n+7) of an $(n+7)^{th}$ stage of shift register unit SR(n+7).

Similarly, FIG. 6C only illustrates a connection manner of the $n^{th}$ stage of shift register unit among N stages of shift registers, wherein the gate driving circuit comprises N stages of shift register units, where n is greater than or equal to 5 and less than or equal to (N−4). The manner in which other stages of shift register units in the gate driving circuit are connected will be apparent to those skilled in the art. For example, unlike the $n^{th}$ stage of shift register unit, INPUT terminals of first, second, third and fourth stages of shift register units are connected to an STV signal, and RESET terminals of $(N-3)^{th}$, $(N-2)^{th}$, $(N-1)^{th}$ and $N^{th}$ stages of shift register units are connected to the STV signal.

In order to facilitate understanding of the technical solutions according to the embodiments of the present disclosure, an example of a specific implementation of the shift register unit according to the embodiments of the present disclosure will be described in detail below. It can be understood by those skilled in the art that the present disclosure is not limited thereto, and the gate driving circuit according to the embodiments of the present disclosure may be implemented by those skilled in the art using various shift register units only by improving a cascading relationship of various shift register units in the gate driving circuit to adjust a phase relationship of clock signals and reset signals.

Figure 7A:
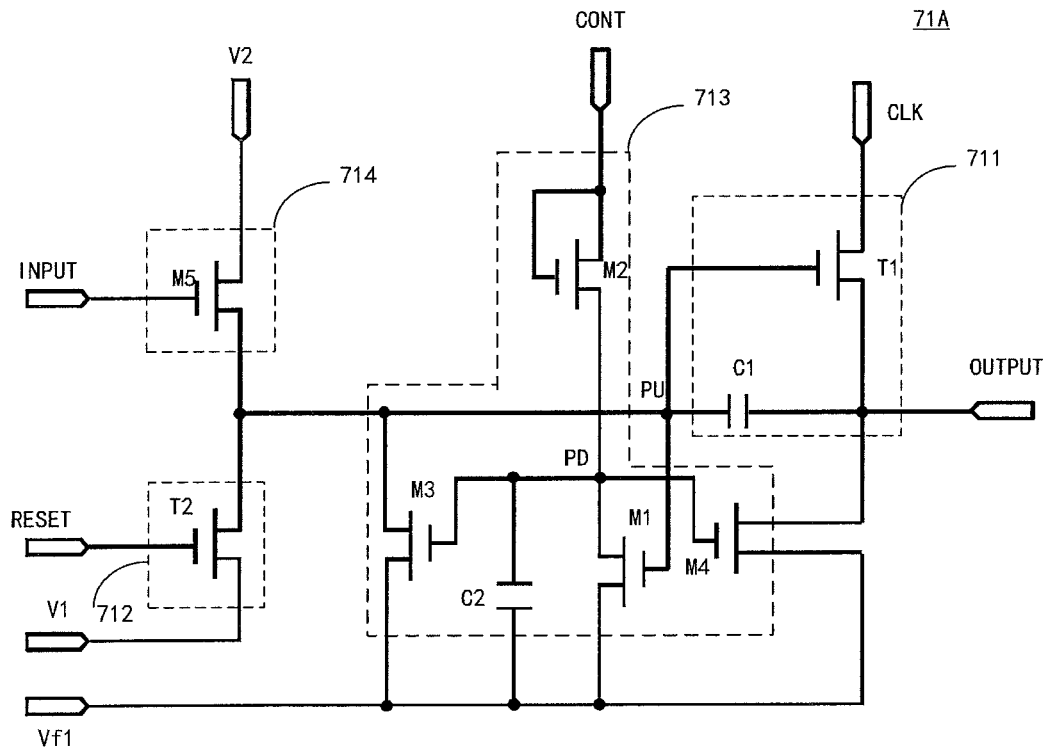
FIG. 7A illustrates an exemplary circuit diagram of a shift register unit according to an embodiment of the present disclosure.

FIG. 7A illustrates an exemplary circuit diagram of a shift register unit according to an embodiment of the present disclosure. As shown in FIG. 7A, the shift register unit 71A according to the embodiment of the present disclosure may comprise an output sub-circuit 711, a reset sub-circuit 712, a control sub-circuit 713, and an input sub-circuit 714. In the example of FIG. 7A, the output sub-circuit 711 may comprise an output transistor T1 and a first capacitor C1. A first electrode of the output transistor T1 and a first electrode of the first capacitor C1 are commonly connected to an output signal terminal OUTPUT of the stage of shift register unit. A gate of the output transistor T1 and a second electrode of the first capacitor C1 are commonly connected to a pull-up control node PU of the shift register unit, and a second electrode of the output transistor T1 is connected to a clock signal terminal CLK of the shift register unit.

The reset sub-circuit 712 may comprise a reset transistor T2. A gate of the reset transistor T2 is connected to a reset signal terminal RESET, a first electrode of the reset transistor T2 is connected to a first level terminal V1, and a second electrode of the reset transistor T2 is connected to the pull-up control node PU. For example, the first level terminal V1 may receive a VSS voltage signal of the gate driving circuit.

The control sub-circuit 713 may comprise a first transistor M1, wherein a gate of the first transistor M1 is connected to the pull-up control node PU, a first electrode of the first transistor M1 is connected to a first fixed level terminal Vf1, and a second electrode of the first transistor M1 is connected to a pull-down control node PD of this stage of shift register unit; a second transistor M2, wherein a gate and a first electrode of the second transistor M2 are connected commonly to a control signal terminal CONT, and a second electrode of the second transistor M2 is connected to the pull-down control node PD; a third transistor M3, wherein a gate of the third transistor M3 is connected to the pull-down control node PD, a first electrode of the third transistor M3 is connected to the first fixed level terminal Vf1, and a second electrode of the third transistor M3 is connected to the pull-up control node PU; a fourth transistor M4, wherein a gate of the fourth transistor M4 is connected to the pull-down control node PD, a first electrode of the fourth transistor M4 is connected to the first fixed level terminal Vf1, and a second electrode of the fourth transistor M4 is connected to an output signal terminal OUTPUT; and a second capacitor C2, wherein a first electrode of the second capacitor C2 is connected to the pull-down control node PD, and a second electrode of the second capacitor C2 is connected to the first fixed level terminal Vf1. For example, in the above example, the first fixed level terminal Vf1 may receive a VGL voltage signal of the gate driving circuit. In the example of FIG. 7A, the control signal terminal CONT may receive a clock signal Clk(n+2).

The input sub-circuit 714 may comprise a fifth transistor M5. A gate of the fifth transistor M5 is connected to an input signal terminal INPUT, a first electrode of the fifth transistor M5 is connected to a second level terminal V2, and a second electrode of the fifth transistor M5 is connected to the pull-up control node PU. For example, the second level terminal V2 may receive a VDD voltage signal of the gate driving circuit.

Figure 7B:
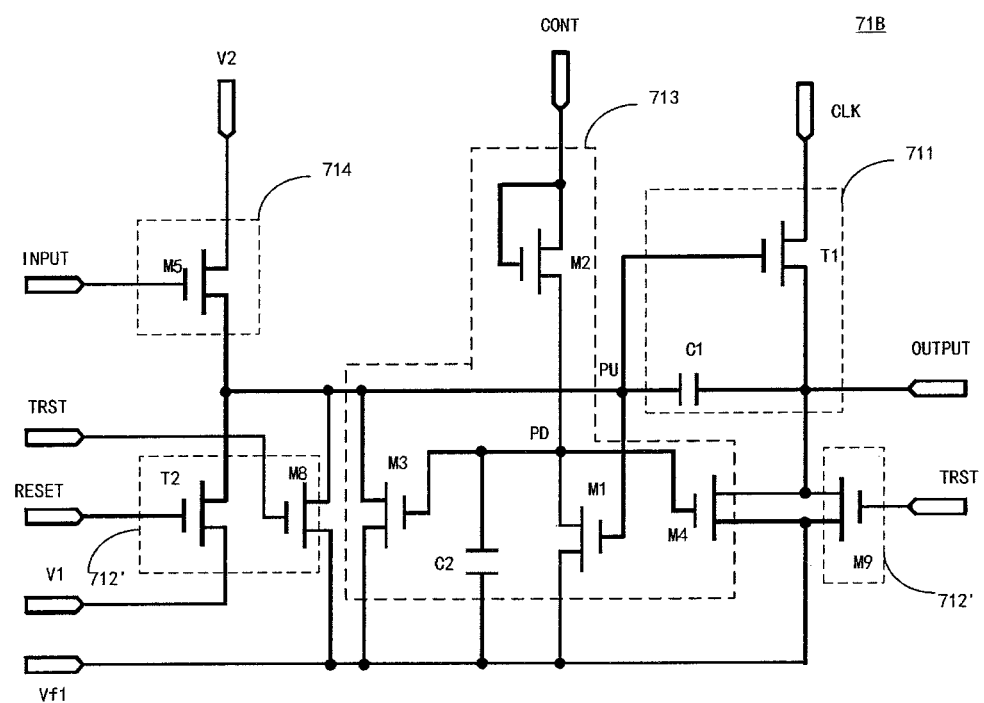
FIG. 7B illustrates another exemplary circuit diagram of a shift register unit according to an embodiment of the present disclosure.

FIG. 7B illustrates another exemplary circuit diagram of a shift register unit according to an embodiment of the present disclosure. As shown in FIG. 7B, the shift register unit 71B according to the embodiment of the present disclosure may comprise an output sub-circuit 711, a reset sub-circuit 712', a control sub-circuit 713, and an input sub-circuit 714.

The embodiment of FIG. 7B differs from the embodiment of FIG. 7A in that the reset sub-circuit 712' is further connected to a total reset signal terminal TRST for receiving a total reset signal. The reset sub-circuit 712' further comprises an eighth transistor M8 and a ninth transistor M9. A gate of the eighth transistor M8 is connected to the total reset signal terminal TRST, a first electrode of the eighth transistor M8 is connected to the first fixed level terminal Vf1, and a second electrode of the eighth transistor M8 is connected to the pull-up control node PU. A gate of the ninth transistor M9 is connected to the total reset signal terminal TRST, a first electrode of the ninth transistor M9 is connected to the first fixed level terminal Vf1, and a second electrode of the ninth transistor M9 is connected to the output signal terminal OUTPUT. For example, the total reset signal terminal TRST may receive a Trst signal of the gate driving circuit. It can be understood by those skilled in the art that the embodiment of FIG. 7A differs from the embodiment of FIG. 7B in that, in the embodiment of FIG. 7B, at the time when scanning of each frame of display image ends, voltages at the PU point and the OUTPUT terminal are reset using the total reset signal Trst. For the sake of brevity, the same circuit structures and signal connections of FIG. 7B as those in FIG. 7A will not be described in detail again.

Figure 7C:
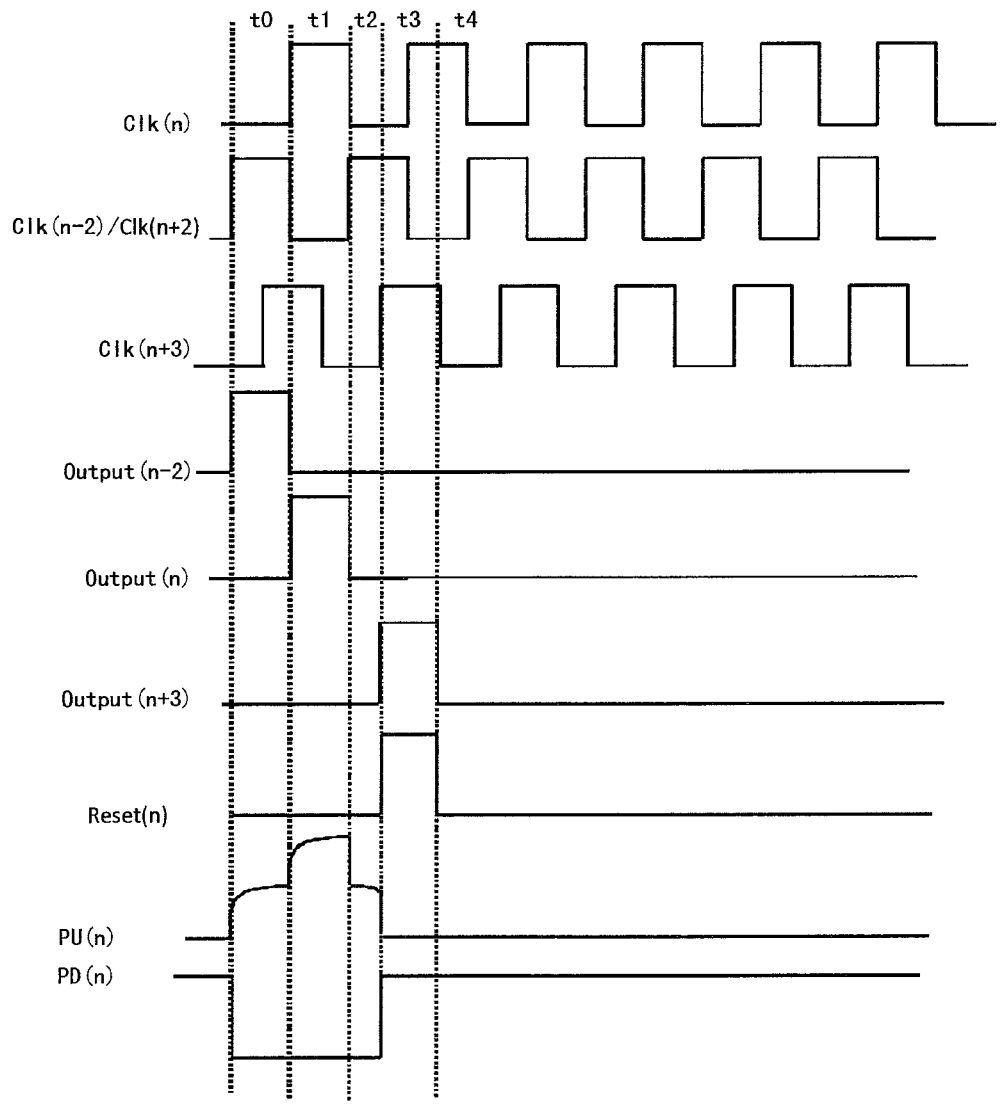
FIG. 7C illustrates an operating timing diagram of a shift register unit according to an embodiment of the present disclosure.

FIG. 7C illustrates an operating timing diagram of a shift register unit according to an embodiment of the present disclosure. A specific operation of the shift register units of FIGS. 7A and 7B will be described below in conjunction with the timing diagram of FIG. 7C. It should be illustrated that, as in FIG. 5C, the following description will be made by taking an $n^{th}$ stage of shift register unit in which four clock signals are used as an example. Further, it can be understood by those skilled in the art that various signals in FIG. 7C have substantially the same timing as that of the respective signals in FIG. 5C, and therefore, for convenience of understanding, the same reference numerals are used to indicate the same time periods.

In a pre-charging time period t0, the input signal terminal INPUT has a second level signal (for example, a high level signal), and the input signal is an output signal Output(n−2) of an $(n-2)^{th}$ stage of shift register unit. The INPUT has a high level signal, so that the fifth transistor M5 is turned on. The second level V2 is a high level, to charge the first capacitor C1 through the fifth transistor M5, so that the voltage at the PU point is pulled up. The PU point is at a high level, so that the output transistor T1 is turned on, and a connection between the output signal terminal OUTPUT and the clock signal terminal is turned on. At this time, Clk(n) is at a first level (for example, a low level), and therefore the output signal terminal OUTPUT is at a low level. Since Vf1 is at a low level, the PD point is pulled to a low level. The PD point is at a low level, so that the third transistor M3 and the fourth transistor M4 are turned off, thereby ensuring stable signal output.

In a first time period t1, Output(n−2) at the input signal terminal INPUT is at a low level, and the fifth transistor M5 is turned off. Due to the action of bootstrapping, the voltage at the PU point rises to a first active operating level and remains at a high potential, and the output transistor T1 remains in a turn-on state. At this time, the clock signal Clk(n) is at a high level, and therefore the output signal terminal OUTPUT outputs a high level signal as a driving signal of the stage of shift register unit. The PU point is at a high level, so that the first transistor M1 is still turned on, and the PD point remains at a low level. As a result, the third transistor M3 and the fourth transistor M4 continue to be turned off, thereby ensuring stable signal output.

In a second time period t2, Clk(n) is at a low level. At this time, the level at the PU point changes from the first active operating level to a second active operating level. Although the level at the PU point at this time is lower than that in the first time period t1, a connection between the output transistor T1 and the first transistor M1 may still be turned on, and therefore both Output(n) and Clk(n) are at a low level. Further, since the first transistor M1 is turned on, the PD point is still at a low level. Since no signal is pulled up, the potential at the PU point continues to drop.

In a third phase t3, a reset signal Reset (i.e., Output(n+3)) is at a high level, so that the reset transistor T2 is in a turn-on state, and the potential at the PU point is pulled down. Thereby, the output transistor T1 and the first transistor M1 are turned off. At the same time, Clk(n+2) is at a high level, so that the second transistor M2 is turned on. Thereby, the second capacitor C2 is charged by Clk(n+2) input at the control signal terminal CONT, so that the PD point is at a high potential. As a result, the third transistor M3 and the fourth transistor M4 are in a turn-on state, to pull the potential at the PU point to the first fixed level Vf1 (for example, VGL). The output signal terminal OUTPUT remains at a low level.

In a fourth time period t4, since the input signal terminal INPUT is at a low level, the fifth transistor M5 is still in a turn-off state. When Clk(n+2) is at a high level, the second transistor M2 is turned on to charge the second capacitor C2. Thereby, the PD point may remain at a high potential, so that the third transistor M3 and the fourth transistor M4 are in a turn-on state, to continuously de-noise the PU point and the OUTPUT terminal, which can eliminate a coupling noise voltage generated by the clock signal, thereby realizing low voltage output and ensuring stable signal output.

The shift register unit is still in the fourth time period t4 before a next frame arrives. In the embodiment of FIG. 7B, after a previous frame ends and before the next frame arrives, Trst is at a high level, so that the eighth transistor M8 is turned on to de-noise the PU point, and the ninth transistor M9 is turned on to de-noise the OUTPUT terminal, thereby ensuring a stable operation in the next frame.

According to the embodiment described above, in the fourth time period t4, the second capacitor C2 is used to maintain the high voltage at the PD point, which can further reduce the power consumption of the circuit.

Figure 8A:
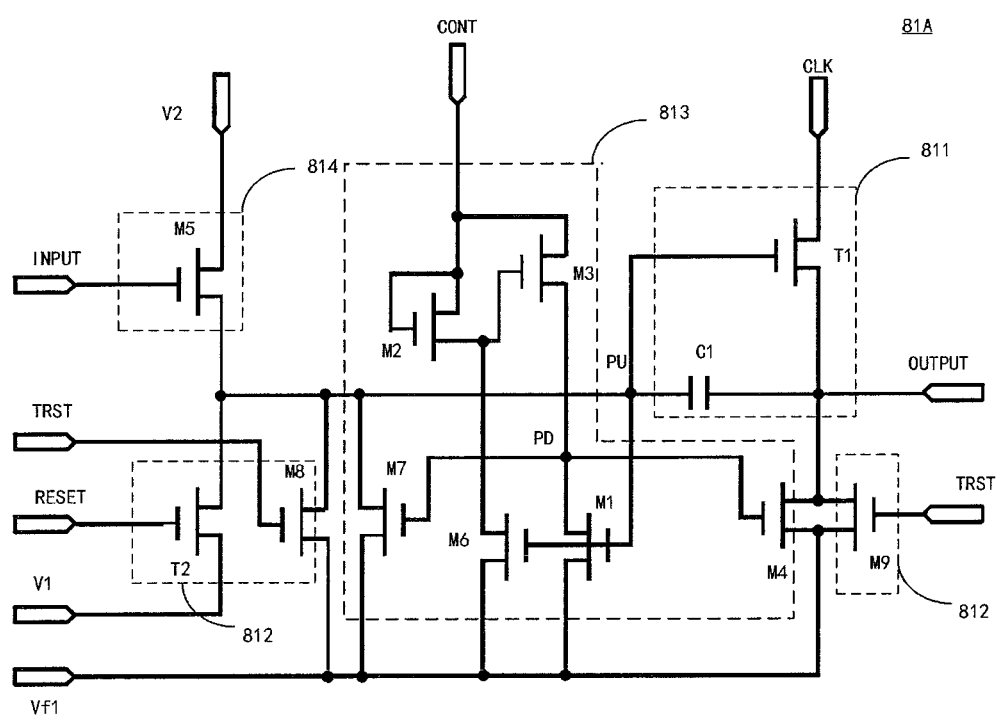
FIG. 8A illustrates another exemplary circuit diagram of a shift register unit according to an embodiment of the present disclosure.

FIG. 8A illustrates another exemplary circuit diagram of a shift register unit according to an embodiment of the present disclosure. As shown in FIG. 8A, a shift register unit 81A according to the embodiment of the present disclosure may comprise an output sub-circuit 811, a reset sub-circuit 812, a control sub-circuit 813, and an input sub-circuit 814. FIG. 8A differs from FIG. 7A in that firstly, a control signal terminal CONT in FIG. 8A may receive a second fixed level Vf2, which is different from the first fixed level Vf1. For example, a signal at the second fixed level may be a VGH signal of the gate driving circuit. Further, similarly to the example of FIG. 7B, the reset sub-circuit 812 in FIG. 8A is further connected to a total reset signal terminal TRST for receiving a total reset signal. The reset sub-circuit 812 further comprises an eighth transistor M8 and a ninth transistor M9. It can be understood by those skilled in the art that FIG. 8A may further have the same reset sub-circuit as that in FIG. 7A.

The control sub-circuit 813 in FIG. 8A may comprise a first transistor M1, wherein a gate of the first transistor M1 is connected to a pull-up control node PU, a first electrode of the first transistor M1 is connected to a first fixed level terminal Vf1, and a second electrode of the first transistor M1 is connected to a pull-down control node PD; a second transistor M2 and a third transistor M3, wherein a gate and a first electrode of the second transistor M2 are connected commonly to the control signal terminal CONT, a second electrode of the second transistor M2 is connected to a gate of the third transistor M3, a first electrode of the third transistor M3 is connected to the control signal terminal CONT, and a second electrode of the third transistor M3 is connected to the pull-down control node PD; a fourth transistor M4, wherein a gate of the fourth transistor M4 is connected to the pull-down control node PD, a first electrode of the fourth transistor M4 is connected to the first fixed level terminal Vf1, and a second electrode of the fourth transistor M4 is connected to an output signal terminal OUTPUT; a sixth transistor M6, wherein a gate of the sixth transistor M6 is connected to the pull-up control node PU, a first electrode of the sixth transistor M6 is connected to the first fixed level terminal Vf1, and a second electrode of the sixth transistor M6 is connected to the gate of the third transistor M3; and a seventh transistor M7, wherein a gate of the seventh transistor M7 is connected to the pull-down control node PD, a first electrode of the seventh transistor M7 is connected to the first fixed level terminal Vf1 and a second electrode of the seventh transistor M7 is connected to the pull-up control node PU.

For the sake of brevity, the same circuit structures and signal connections in FIG. 8A as those in FIGS. 7A and 7B will not be described in detail again.

It should be illustrated that various signals of the shift register unit in FIG. 8A have substantially the same waveforms as those in FIGS. 7A and 7B. Therefore, a specific operation of the shift register circuit of FIG. 8A will be described below with reference to the timing diagram of FIG. 7C. Similarly, the following description will be made by taking an $n^{th}$ stage of shift register unit in which four clock signals are used as an example.

In a pre-charging time period t0, the input signal terminal INPUT has a high level signal, and the input signal is an output signal Output(n−2) of an $(n-2)^{th}$ stage of shift register unit. The INPUT has a high level signal, so that the fifth transistor M5 is turned on. The second level V2 is a high level, to charge the first capacitor C1 through the fifth transistor M5, so that the voltage at the PU point is pulled up. The PU point is at a high level, so that the output transistor T1, the first transistor M1 and the sixth transistor M6 are turned on, and thereby the third transistor M3 is turned off. At this time, Clk(n) is at a low level, and therefore the output signal terminal OUTPUT is at a low level. Since Vf1 is at a low level, the PD point is pulled to a low level. The PD point is at a low level, so that the third transistor M3 and the seventh transistor M7 are turned off, thereby ensuring stable signal output.

In a first time period t1, Output(n−2) at the input signal terminal INPUT is at a low level, and the fifth transistor M5 is turned off. Due to the action of bootstrapping, the voltage at the PU point rises to a first active operating level and remains at a high potential, and the output transistor T1 remains in a turn-on state. At this time, the clock signal Clk(n) is at a high level, so that the output signal terminal OUTPUT outputs a high level signal as a driving signal of the stage of shift register unit. At this time, the PU point is at a high potential, so that the first transistor M1 and the sixth transistor M6 are still turned on, and thereby the PD point remains at a low level. As a result, the third transistor M3 and the seventh transistor M7 continue to be turned off, thereby ensuring stable signal output.

In a second time period t2, Clk(n) is at a low level, and the level at the PU point changes from the first active operating level to a second active operating level. Although the level at the PU point at this time is lower than that in the first time period t1, a connection between the output transistor T1 and the first transistor M1 may still be turned on, and therefore both Output(n) and Clk(n) are at a low level. Further, since the first transistor M1 is turned on, the PD point is still at a low level. Since no signal is pulled up, the voltage at the PU point continues to drop.

In a third time period t3, a reset signal Reset (i.e., Output(n+3)) is at a high level, so that the reset transistor T2 is in a turn-on state, and the potential at the PU point is pulled down. Thereby, the output transistor T1, the first transistor M1 and the sixth transistor M6 are turned off. At the same time, VGH is at a high level, so that the second transistor M2 and the third transistor M3 are turned on. Thereby, the second capacitor C2 is charged by VGH at a high level which is input at the control signal terminal CONT, so that the PD point is at a high potential. As a result, the fourth transistor M4 and the seventh transistor M7 are in a turn-on state, to pull the potential at the PU point to the first fixed level Vf1 (for example, VGL). The output signal terminal OUTPUT remains at a low level. It can be understood by those skilled in the art that a gate voltage of the third transistor may be controlled by a ratio of channel width to length ratios of the second transistor M2 and the sixth transistor M6.

In a fourth time period t4, since the input signal terminal INPUT is at a low level, the fifth transistor M5 is still in a turn-off state. VGH is at a high level, so that the PD point may remain at a high level, and thereby the fourth transistor M4 and the seventh transistor M7 are still in a turn-on state, to continuously de-noise the PU point and the OUTPUT terminal, which can eliminate a coupling noise voltage generated by the clock signal, thereby realizing low voltage output and ensuring stable signal output.

The shift register unit is still in the fourth time period t4 before a next frame arrives. In the embodiment of FIG. 8A, after a previous frame ends and before the next frame arrives, Trst is at a high level, so that the eighth transistor M8 is turned on to de-noise the PU point, and the ninth transistor M9 is turned on to de-noise the OUTPUT terminal, thereby ensuring a stable operation in the next frame.

Figure 8B:
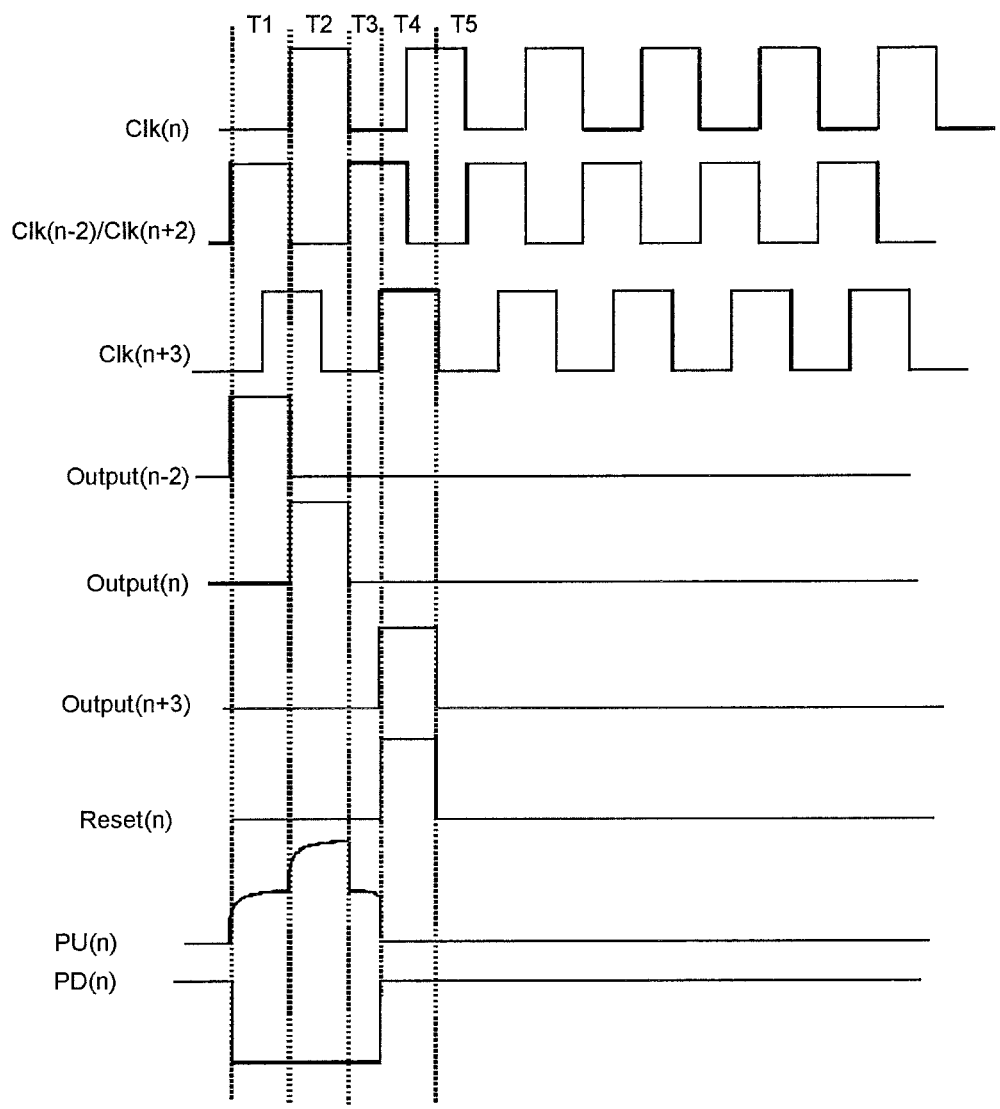
FIG. 8B illustrates another exemplary circuit diagram of a shift register unit according to an embodiment of the present disclosure.

FIG. 8B illustrates another exemplary circuit diagram of a shift register unit according to an embodiment of the present disclosure. As shown in FIG. 8B, a shift register unit 81B according to the embodiment of the present disclosure may comprise an output sub-circuit 811, a reset sub-circuit 812', a control sub-circuit 813, and an input sub-circuit 814. FIG. 8B differs from FIG. 8A in that, the reset sub-circuit 812' in FIG. 8B further comprises a tenth transistor M10. A gate of the tenth transistor M10 is connected to a reset signal terminal RESET, a first electrode of the tenth transistor M10 is connected to a second fixed level terminal Vf2, and a second electrode of the tenth transistor M10 is connected to a pull-down control node PD.

For the sake of brevity, the same circuit structures and signal connections in FIG. 8B as those in FIGS. 7A, 7B and 8A will not be described in detail again.

It should be illustrated that various signals of the shift register unit in FIG. 8B have substantially the same waveforms as those in FIGS. 7A and 7B. In addition, except for a third time period t3, operations of the shift register unit 81B in FIG. 8B in time periods t0, t1, t2 and t4 are the same as those of the shift register unit 81A in FIG. 8A, and will not be described in detail here for the sake of brevity. An operation of the shift register unit 81B according to the embodiment of the present disclosure in the third time period t3 will be described in detail below.

In the third time period t3, a reset signal Reset (i.e., Output(n+3)) is at a high level, so that the reset transistor T2 and the tenth transistor T10 are in a turn-on state, and the potential at the PU point is pulled down. Thereby, the output transistor T1, the first transistor M1 and the sixth transistor M6 are turned off. At the same time, VGH is at a high level, so that the second transistor M2 and the third transistor M3 are turned on. Thereby, the second capacitor C2 is charged by VGH at a high level which is input at the control signal terminal CONT, so that the PD point is at a high potential. As a result, the fourth transistor M4 and the seventh transistor M7 are in a turn-on state, to pull the potential at the PU point to the first fixed level Vf1 (for example, VGL). The output signal terminal OUTPUT remains at a low level.

By disposing the tenth transistor M10, it is possible to speed up the rising of the potential at the PD point, so that the time required for reducing a level at the PU point to a low level is reduced, thereby increasing the output stability.

Figure 9:
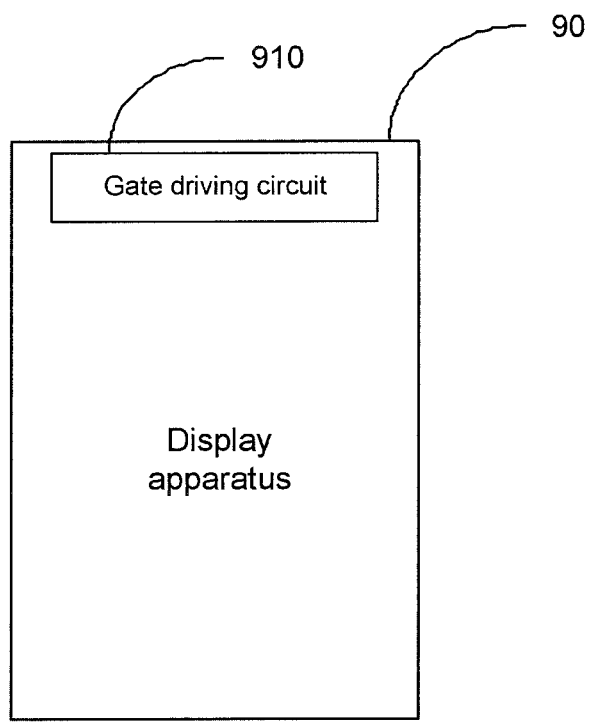
FIG. 9 illustrates a schematic block diagram of a display apparatus according to an embodiment of the present disclosure.

FIG. 9 illustrates a schematic block diagram of a display apparatus according to an embodiment of the present disclosure. As shown in FIG. 9, the display apparatus 90 may comprise a gate driving circuit 910 according to an embodiment of the present disclosure. The display apparatus 90 according to the embodiment of the present disclosure may be any product or component having a display function such as an electronic paper, a mobile phone, a tablet computer, a television, a display, a notebook computer, a digital photo frame, a navigator, etc.

The specific embodiments described above further illustrate the purposes, technical solutions and beneficial effects of the embodiments of the present disclosure. It is to be understood that the foregoing description is merely specific embodiments of the present disclosure, and is not intended to limit the present disclosure. Any modifications, equivalent substitutions, improvements etc. made within the spirit and principle of the present disclosure shall be included within the protection scope of the present disclosure.

We claim:

1. A gate driving circuit, comprising N stages of cascaded shift registers, N being an integer greater than or equal to 4, wherein in the N stages of shift registers, an output signal terminal of an $n^{th}$ stage of shift register is connected to an input signal terminal of an $(n+I/2)^{th}$ stage of shift register, and a reset signal terminal of the $n^{th}$ stage of shift register is connected to an output signal terminal of an $(n+K)^{th}$ stage of shift register, wherein n is an integer greater than or equal to 1 and less than (N−I/2), K is an integer greater than I/2 and less than I, and I is a number of clock signal lines connected to the gate driving circuit, which is an even number greater than or equal to 4;

wherein each stage of shift register among the N stages of shift registers comprises:

an output sub-circuit connected to an output signal terminal, a clock signal input terminal for receiving a clock signal of the stage of shift register and a pull-up control node of the stage of shift register, and configured to turn on a connection between the clock signal input terminal and the output signal terminal when the pull-up control node is at an active operating level;

a reset sub-circuit connected to a reset signal terminal for receiving a reset signal, the pull-up control node and a first level terminal for providing a first level respectively, and configured to reset the pull-up control node to the first level under control of the reset signal;

an input sub-circuit connected to an input signal terminal for receiving an input signal, the pull-up control node of the stage of shift register and a second level terminal for providing a second level respectively, and configured to provide the second level to the pull-up control node under control of the input signal, wherein the second level is different from the first level; and a control sub-circuit connected to a control signal terminal for receiving a control signal, a first fixed level terminal for providing a first fixed level, the output signal terminal and the pull-up control node respectively, and configured to turn on a connection between the first fixed level terminal and the output signal terminal under control of the control signal and the pull-up control node;

wherein the control sub-circuit comprises:

a first transistor, wherein a gate of the first transistor is connected to the pull-up control node, a first electrode of the first transistor is connected to the first fixed level terminal, and a second electrode of the first transistor is connected to a pull-down control node of the stage of shift register;

a second transistor, wherein a gate and a first electrode of the second transistor are connected commonly to the control signal terminal, and a second electrode of the second transistor is connected to the pull-down control node;

a third transistor, wherein a gate of the third transistor is connected to the pull-down control node, a first electrode of the third transistor is connected to the first fixed level terminal, and a second electrode of the third transistor is connected to the pull-up control node;

a fourth transistor, wherein a gate of the fourth transistor is connected to the pull-down control node, a first electrode of the fourth transistor is connected to the first fixed level terminal, and a second electrode of the fourth transistor is connected to the output signal terminal; and a second capacitor, wherein a first electrode of the second capacitor is connected to the pull-down control node, and a second electrode of the second capacitor is connected to the first fixed level terminal; and wherein the control signal is an inversion of the clock signal of the stage of shift register.

2. The gate driving circuit according to claim 1, wherein a first stage of shift register to an $N^{th}$ stage of shift register are sequentially connected to, through the clock signal terminals thereof, a first clock signal line to an $I^{th}$ clock signal line which are arranged sequentially and cyclically, so as to receive a first clock signal to an $I^{th}$ clock signal, respectively, wherein every two adjacent clock signals are different by 1/I of a clock cycle.

3. The gate driving circuit according to claim 2, wherein each clock signal has a duty ratio of 50%.

4. The gate driving circuit according to claim 1, wherein the control sub-circuit comprises:

a first transistor, wherein a gate of the first transistor is connected to the pull-up control node, a first electrode of the first transistor is connected to the first fixed level terminal, and a second electrode of the first transistor is connected to the pull-down control node;

a second transistor and a third transistor, wherein a gate and a first electrode of the second transistor are commonly connected to the control signal terminal, a second electrode of the second transistor is connected to a gate of the third transistor, a first electrode of the third transistor is connected to the control signal terminal, and a second electrode of the third transistor is connected to the pull-down control node;

a fourth transistor, wherein a gate of the fourth transistor is connected to the pull-down control node, a first electrode of the fourth transistor is connected to the first fixed level terminal, and a second electrode of the fourth transistor is connected to the output signal terminal;

a sixth transistor, wherein a gate of the sixth transistor is connected to the pull-up control node, a first electrode of the sixth transistor is connected to the first fixed level terminal, and a second electrode of the sixth transistor is connected to the gate of the third transistor; and a seventh transistor, wherein a gate of the seventh transistor is connected to the pull-down control node, a first electrode of the seventh transistor is connected to the first fixed level terminal, and a second electrode of the seventh transistor is connected to the pull-up control node.

5. The gate driving circuit according to claim 4, wherein the control signal is a signal at a second fixed level different from the first fixed level.

6. The gate driving circuit according to claim 4, wherein the reset sub-circuit comprises a reset transistor, wherein a gate of the reset transistor is connected to the reset signal terminal, a first electrode of the reset transistor is connected to the first level terminal, and a second electrode of the reset transistor is connected to the pull-up control node.

7. The gate driving circuit according to claim 6, wherein the reset sub-circuit is further connected to a total reset signal terminal for receiving a total reset signal, and the reset sub-circuit further comprises an eighth transistor and a ninth transistor, wherein a gate of the eighth transistor is connected to the total reset signal terminal, a first electrode of the eighth transistor is connected to the first fixed level terminal, and a second electrode of the eighth transistor is connected to the pull-up control node; and a gate of the ninth transistor is connected to the total reset signal terminal, a first electrode of the ninth transistor is connected to the first fixed level terminal, and a second electrode of the ninth transistor is connected to the output signal terminal.

8. The gate driving circuit according to claim 7, wherein the reset sub-circuit further comprises a tenth transistor, wherein a gate of the tenth transistor is connected to the reset signal terminal, a first electrode of the tenth transistor is connected to the control signal terminal, and a second electrode of the tenth transistor is connected to the pull-down control node.

9. A display apparatus, comprising the gate driving circuit comprising N stages of cascaded shift registers, N being an integer greater than or equal to 4,
wherein in the N stages of shift registers, an output signal terminal of an $n^{th}$ stage of shift register is connected to an input signal terminal of an $(n+I/2)^{th}$ stage of shift register, and a reset signal terminal of the $n^{th}$ stage of shift register is connected to an output signal terminal of an $(n+K)^{th}$ stage of shift register, wherein n is an integer greater than or equal to 1 and less than (N−I/2), K is an integer greater than I/2 and less than I, and I is a number of clock signal lines connected to the gate driving circuit, which is an even number greater than or equal to 4;
wherein each stage of shift register among the N stages of shift registers comprises:
an output sub-circuit connected to an output signal terminal, a clock signal input terminal for receiving a clock signal of the stage of shift register and a pull-up control node of the stage of shift register, and configured to turn on a connection between the clock signal input terminal and the output signal terminal when the pull-up control node is at an active operating level;
a reset sub-circuit connected to a reset signal terminal for receiving a reset signal, the pull-up control node and a first level terminal for providing a first level respectively, and configured to reset the pull-up control node to the first level under control of the reset signal;
an input sub-circuit connected to an input signal terminal for receiving an input signal, the pull-up control node of the stage of shift register and a second level terminal for providing a second level respectively, and configured to provide the second level to the pull-up control node under control of the input signal, wherein the second level is different from the first level; and
a control sub-circuit connected to a control signal terminal for receiving a control signal, a first fixed level terminal for providing a first fixed level, the output signal terminal and the pull-up control node respectively, and configured to turn on a connection between the first fixed level terminal and the output signal terminal under control of the control signal and the pull-up control node;
wherein the control sub-circuit comprises:
a first transistor, wherein a gate of the first transistor is connected to the pull-up control node, a first electrode of the first transistor is connected to the first fixed level terminal, and a second electrode of the first transistor is connected to a pull-down control node of the stage of shift register;
a second transistor, wherein a gate and a first electrode of the second transistor are connected commonly to the control signal terminal, and a second electrode of the second transistor is connected to the pull-down control node;
a third transistor, wherein a gate of the third transistor is connected to the pull-down control node, a first electrode of the third transistor is connected to the first fixed level terminal, and a second electrode of the third transistor is connected to the pull-up control node;
a fourth transistor, wherein a gate of the fourth transistor is connected to the pull-down control node, a first electrode of the fourth transistor is connected to the first fixed level terminal, and a second electrode of the fourth transistor is connected to the output signal terminal; and
a second capacitor, wherein a first electrode of the second capacitor is connected to the pull-down control node, and a second electrode of the second capacitor is connected to the first fixed level terminal; and
wherein the control signal is an inversion of the clock signal of the stage of shift register.

10. The gate driving circuit according to claim 1, wherein a first stage of shift register to an $N^{th}$ stage of shift register are sequentially connected to, through the clock signal terminals thereof, a first clock signal line to an $I^{th}$ clock signal line which are arranged sequentially and cyclically, so as to receive a first clock signal to an $I^{th}$ clock signal, respectively, wherein every two adjacent clock signals are different by 1/I of a clock cycle.

11. The gate driving circuit according to claim 10, wherein each clock signal has a duty ratio of 50%.

* * * * *